(12) United States Patent
Savas et al.

(10) Patent No.: US 6,551,447 B1
(45) Date of Patent: Apr. 22, 2003

(54) INDUCTIVE PLASMA REACTOR

(75) Inventors: Stephen E. Savas, Alameda, CA (US);
Brad S. Mattson, Los Gatos, CA (US);
Martin L. Hammond, Cupertino, CA (US); Steven C. Selbrede, San Jose, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 09/707,368

(22) Filed: Nov. 6, 2000

Related U.S. Application Data

(63) Continuation of application No. 09/118,281, filed on Jul. 17, 1998, now Pat. No. 6,143,129, which is a continuation of application No. 08/340,696, filed on Nov. 15, 1994, now Pat. No. 5,811,022.

(51) Int. Cl.$^7$ .............................. H01L 21/00; H05H 1/00
(52) U.S. Cl. ................ 156/345.48; 118/723 I; 118/723 IR
(58) Field of Search .................. 156/345.48; 118/723 I, 118/723 IR

(56) References Cited

U.S. PATENT DOCUMENTS

| | | | |
|---|---|---|---|
| 4,132,613 A | 1/1979 | Penfold et al. | 204/192 |
| 4,252,608 A | 2/1981 | Baldwin et al. | 176/3 |
| 4,431,898 A | 2/1984 | Reinberg et al. | 219/121 |
| 4,450,787 A | 5/1984 | Weakliem et al. | 118/723 |
| 4,844,775 A | 7/1989 | Keeble | 156/643 |
| 4,918,031 A | 4/1990 | Flamm et al. | 437/225 |
| 4,948,458 A | 8/1990 | Ogle | 156/643 |
| 5,057,187 A | 10/1991 | Shinagawa et al. | 156/643 |
| 5,108,535 A | 4/1992 | Ono et al. | 156/345 |
| 5,122,251 A * | 6/1992 | Campbell et al. | 156/345 |

FOREIGN PATENT DOCUMENTS

| | | | |
|---|---|---|---|
| DK | 3801309 | 7/1989 | |
| EP | 0 131 433 | 1/1985 | |
| EP | 0 132 015 | 1/1985 | |
| EP | 0 443 154 | 8/1991 | |
| JP | 59-84528 | 5/1984 | ............. C23F/1/08 |
| JP | 6-84837 | 3/1994 | ......... H01L/21/302 |
| WO | WO 91/10341 | 7/1991 | |

OTHER PUBLICATIONS

"Plasma Physics—Study of the electron temperature and density of an inductive HF discharge in hydrogen, using the symmetrical double–probe method"—report by Mr. Guy Turban, as presented by Mr. Louis Nèel. C.R. Acad. Sc. Paris, vol. 273 (Sep. 27, 1971), Series B, pp 533–536. Both the French article and English translation of the text are included.

(List continued on next page.)

*Primary Examiner*—Thi Dang
(74) *Attorney, Agent, or Firm*—Wilson Sonsini Goodrich & Rosati

(57) ABSTRACT

A plasma reactor and methods for processing semiconductor wafers are described. Gases are introduced into a reactor chamber. An induction coil surrounds the reactor chamber. RF power is applied to the induction coil and is inductively coupled into the reactor chamber causing a plasma to form. A split Faraday shield is interposed between the induction coil and the reactor chamber to substantially block the capacitive coupling of energy into the reactor chamber which may modulate the plasma potential. The configuration of the split Faraday shield may be selected to control the level of modulation of the plasma potential. For etch processes, a separate powered electrode may be used to accelerate ions toward a wafer surface. For isotropic etching processes, charged particles may be filtered from the gas flow, while a neutral activated species passes unimpeded to a wafer surface.

31 Claims, 12 Drawing Sheets

U.S. PATENT DOCUMENTS

| | | | |
|---|---|---|---|
| 5,198,634 A | 3/1993 | Mattson et al. | 219/121.43 |
| 5,217,560 A | 6/1993 | Kurono et al. | 156/345 |
| 5,226,056 A | 7/1993 | Kikuchi et al. | 373/18 |
| 5,228,052 A | 7/1993 | Kikuchi et al. | 373/18 |
| 5,234,529 A | 8/1993 | Johnson | 156/345 |
| 5,284,544 A | 2/1994 | Mizutani et al. | 156/345 |
| 5,284,547 A | 2/1994 | Watanabe | 156/626 |
| 5,294,292 A | 3/1994 | Yamashita et al. | 156/643 |
| 5,310,456 A | 5/1994 | Kadomura | 156/657 |
| 5,312,518 A | 5/1994 | Kadomura | 156/662 |
| 5,350,480 A | 9/1994 | Gray | 156/345 |
| 5,385,624 A | 1/1995 | Amemiya et al. | 156/345 |
| 5,449,432 A | 9/1995 | Hanawa | 156/643.1 |
| 5,449,433 A | 9/1995 | Donohoe | 156/345 X |
| 5,462,629 A | 10/1995 | Kubota et al. | 156/345 |
| 5,462,635 A | 10/1995 | Ono et al. | 156/345 |
| 5,518,572 A | 5/1996 | Kinoshita et al. | 156/345 |
| 5,534,231 A | 7/1996 | Savas | 216/67 |
| 5,556,501 A | 9/1996 | Collins et al. | 156/345 |
| 5,647,913 A | 7/1997 | Blalock | 118/723 I |
| 5,696,428 A | 12/1997 | Pasch | 315/111.21 |
| 5,811,022 A | 9/1998 | Savas et al. | 216/68 |
| 6,068,784 A | 5/2000 | Collins et al. | 216/68 |

OTHER PUBLICATIONS

"Plasma Physics—Measurement of the energy–distribution function of electrons in an inductive HF discharge in hydrogen, using the asymmetric triple–probe method"—report by Mr. Guy Turban, as presented by Mr. Louis Nèel. C.R. Acad. Sc. Paris, vol. 273 (Oct. 4, 1971), Series B, pp 584–587. Both the French article and English translation of the text are included.

"The Hundred Year History Of Induction Discharges", Hans U. Eckert, Proceedings 2nd Annual International Conference on Plasma Chemistry and Technology, Herman Boenig, Ed., Techromic Publ., Lancaster, PA, 1986, pp 171–202.

"ICRH Antenna Design And Coupling Optimization Studies", R. R. Weynants et al., Proceedings of the 2nd Joint Grenoble–Vienna International Symposium, vol. 1 (Como, Italy) 1980.

John A. Thornton, "Plasma–Assisted Deposition Processes: Theory, Mechanisms and Applications", *Thin Solid Films*, vol. 107, 1983, pp. 3–19.

*Techniques and Applications of Plasma Chemistry*, published by John Wiley & Sons, 1974, pp. 322–324.

B. A. Probyn, "Sputtering of Insulators in an RF Discharge", *Vacuum*, vol. 18, No. 5, 1968, pp. 253–257.

Takuo Sugano, "Applications of Plasma Processes to VLSI Technology", 1985, pp. 209 and 213.

J. W. Coburn, "Summary Abstract: Ion–Enhanced Gas–Surface Chemistry", *J. Vac. Sci. Technol.*, vol. 21, No. 2, Jul./Aug. 1982, pp. 557–558.

Daniel L. Flamm et al., "The Design of Plasma Etchants", *Plasma Chemistry and Plasma Processing*, vol. 1, No. 4, 1981, pp. 317–363.

J. Freisinger et al., "RF–ION Source RIM IO for Material Processing with Reactive Gases", GD88, Venezia Sep. 19–23, 1988 IX International Conference on Gas Discharges and Their Applications.

J. W. Coburn et al., "Positive–ion bombardment of substrates in rf diode glow discharge sputtering", J. Appl. Phys. vol. 43, No. 12, Dec. 1972, pp. 4965–4971.

J. Freisinger et al., "The neutral particle injectors RIG for fusion reactors", Atomkernenergie Kerntechnik, vol. 44 (1984) No. 1, pp. 81–86.

J. L. Vossen, "Glow Discharge Phenomena in Plasma Etching and Plasma Deposition", J. Electrochem Soc., Feb. 1979, vol. 126, No. 2, pp. 319–324.

* cited by examiner

INDUCTIVE PLASMA REACTOR

This application is a continuation of allowed U.S. patent application Ser. No. 09/118,281 filed Jul. 17, 1998, now U.S. Pat. No. 6,143,129 which is a continuation Ser No. 08/340,696 filed Nov. 15, 1994, now U.S. Pat. No. 5,811,022 issued Sep. 22, 1998.

BACKGROUND OF THE INVENTION

1. Field of the Invention

The field of the present invention relates in general to plasma reactors and processes typically used for wafer processing or the like. More particularly, the field of the invention relates to a wafer processing plasma reactor in which the plasma is generated primarily by inductively coupled power.

2. Background

A variety of approaches are currently in use for deposition, etching, resist removal, and related processing for semiconductor wafers and other substrates. A typical process may involve the placement of photoresist, the etching of areas unprotected by the resist, and the removal of the residual resist. One method for etching and resist removal involves the immersion of the substrate in a chemical bath that attacks the substrate or the resist. This method is generally known as wet chemical etching or stripping. While wet etching is conceptually straightforward, it has significant disadvantages. For instance, wet etching requires the storage, handling, and disposal of toxic chemicals. In addition, wet chemical etch is isotropic, that is, it occurs in all directions relatively equally. This leads to undesired lateral etching under the photoresist, called undercutting, which limits the dimensional control that can be achieved with wet etch.

An alternative processing technology involves the use of a plasma for deposition, etching, resist removal, or the like. A plasma is a nearly electrically neutral ionized gas. It contains a substantial density of free electrons and positively charged ions. To remain ionized, a gas must constantly receive energy to offset the recombination of charged particles which occurs mostly on the walls of the reactor chamber. In conventional anisotropic plasma processing, the pressure must also be kept low to reduce the collision rate of the ions. Plasmas for etching are typically formed by applying a radio-frequency (RF) electric field to a gas held at low pressure in a vacuum chamber.

Anisotropic plasma etching in the fabrication of integrated circuit devices is desirable because it can much better control feature dimensions and sidewall profiles by processing under conditions far from thermodynamic equilibrium. This enables the production of integrated circuit features having sidewalls with a precisely defined location that extend substantially vertically from the edges of the masking layer. This is important in devices that have a feature size and spacing comparable to the death of the etch.

In FIG. 1 is shown a typical wafer processing plasma reactor used for etching. This reactor includes a metal wall 1 that encloses a plasma reactor chamber 2. Wall 1 is grounded and functions as one of the plasma electrodes. Gases are supplied to chamber 2 from a gas source 3 and are exhausted by an exhaust system 4 that actively pumps gases out of the reactor to maintain a low pressure suitable for a plasma process. An RF power supply 5 is connected to a second, powered electrode 6 that capacitively couples power into the chamber 2 to form a plasma. A wafer 7 is positioned on or near powered electrode 6 for processing. Wafers are transferred into and out of the reactor chamber 2 through a port such as slit valve 8 or the like.

RF power at 13.56 MHz is predominantly used in plasma reactors because this frequency is an ISM (Industry, Scientific, Medical) standard frequency for which government mandated radiation limits are less stringent than at non-ISM frequencies, particularly those within the communication bands. The substantially universal use of 13.56 Mhz is further encouraged by the large amount of equipment available at that frequency because of this ISM standard. Other ISM standard frequencies are at 27.12 and 40.68 MHz, which are first and second order harmonics of the 13.56 MHz ISM standard frequency.

This energy is applied to a gas in the reactor chamber to form a plasma. The plasma consists of two qualitatively different regions: a quasineutral, equipotential conductive plasma body 9 and a boundary layer 10 called the plasma sheath. The plasma body consists of substantially equal densities of negative and positive charged particles as well as radicals and stable neutral particles. RF power coupled into the reactor chamber couples energy into the free electrons, imparting sufficient energy to many of these electrons that ions can be produced through collisions of these electrons with gas molecules. In addition to this ionization, dissociation and excitation of molecules occur within the plasma body. In dissociation, a molecule, such as $O_2$, breaks down into smaller fragments, such as atomic oxygen. In excitation, the molecule holds together, but absorbs energy and enters an excited electronic state. Control of the relative amounts of ionization, dissociation, and excitation depends upon a variety of factors, including the pressure and level of energy applied to the plasma.

A plasma comprises a plurality of mobile charge carriers and thus is a conductive medium.

Therefore, the interior of the plasma is at a roughly uniform electric potential. However, the plasma cannot exist for long in contact with a material object, and is separated from objects by a so called sheath. The plasma sheath is an electron deficient, poorly conductive region in which the electric field strength is large. The plasma sheath has a perpendicular electric field between the plasma body and any interface with a material object such as the reactor walls and the electrodes. The electric field at the interface with the wafers causes ions to accelerate perpendicularly into the surface of the wafers. This perpendicular bombardment makes anisotropic etching possible. Typically, a wafer 7 is positioned on or slightly above the powered electrode 6 where there is a strong "self" bias which enhances ion impact energy and thus the etching process so commercially viable etch rates may be obtained.

However, many modern IC structures are sensitive to ion bombardment by high energy (>100 eV) ions such as in the conventional plasma etch apparatus of FIG. 1. Other etching processes require even lower ion energies to maintain selectivity. Because wafer damage decreases with decreasing ion energy and associated sheath voltage, it would be advantageous to operate at smaller discharge power levels and voltages. Unfortunately, for capacitively coupled power at 13.56 MHz, this reduction of voltage results in a proportionately lower rate of creation of reactive species and ions and therefore results in a slower etch rate for many processes, which significantly degrades process throughput.

Etch rates depend upon the ion current density at the wafer surface and the sheath voltage at the powered electrode (which determines the energy of the ions bombarding the surface for etching). With decreased sheath voltage the ion current density at the wafer must be increased to maintain a substantially constant etch rate. This requires that the plasma ion density near the wafer be increased. Unfortunately, in a conventional plasma etcher, both the sheath voltage of the powered electrode and the ion density near that electrode increase or decrease together and are monotonically increasing functions of the amplitude of the RF voltage applied to the powered electrode. Thus, if the sheath voltage is decreased by decreasing the voltage of the RF signal, the ion current density at the wafer also decreases thereby producing an even greater decrease in the etch rate than would be the case from a decrease in the sheath voltage alone. It is desirable, therefore, to independently control the sheath voltage and ion density at the wafer so that a soft etch process (i.e., an etch process with reduced sheath voltage at the wafer) can be implemented that has a commercially adequate etch rate.

Induction coils surrounding a reactor chamber may be used to inductively couple RF energy into a plasma to control the composition and density of the plasma for semiconductor processing. A separate powered electrode adjacent to a wafer is used to accelerate ions toward the wafer surface for etching. These two mechanisms may be used to control the ion density and energies in the plasma, thereby allowing high etch rates with low ion energies.

However, problems are encountered with known methods of inductively coupling energy into a plasma reactor. The source of the inductive energy, such as induction coils, may also act to capacitively couple current into the reactor which modulates the potential of the plasma sheath at the frequency of the RF source. Thus, the source of inductive energy—used to control ion density—may also affect the ions energies such that ion density and energy are not in fact independent. This may in turn degrade the symmetry of the etch and may damage substrates sensitive to voltage fluctuations. It will also increase the time-averaged plasma potential and thereby increase the energies of ions bombarding the wafer and may adversely affect the selectivity of the etch.

Thus, what is needed for etching is a method for independently controlling ion density and ion energy at a wafer surface. What is also needed is a method of inductively coupling energy into a plasma to produce ions without substantially modulating the sheath potential.

Plasma reactors are also used in processes that are even more sensitive to ion energies and modulation of the sheath potential, such as resist removal. After resist is used in the etching process, it must be removed. The resist is typically an organic film such as a hydrocarbon polymer. Typical resist removal involves the production of large amounts of atomic oxygen through dissociation. When exposed to the atomic oxygen, the hydrocarbon resist film will burn away. This particular process of resist removal is therefore often referred to as ashing. Additives or other gases may be used to remove other films in a similar manner.

Whereas etching depends upon bombardment by ions with relatively high energies, resist removal and similar processes depend upon the chemical reaction of an activated species (such as dissociated oxygen atoms) with a film on the semiconductor wafer. Typically, RF or microwave power is coupled into a gas to form a plasma. The plasma acts as a source of dissociated atoms or reaction with the film on the wafer.

In contrast to etch processes, however, it is not desirable to expose the semiconductor wafers directly to the plasma. Direct contact with the plasma will cause a high flux of charged particles to the wafer and a plasma sheath to form adjacent to the wafer surface, which may cause sputtering by ions from the plasma. The semiconductor wafers may thus be damaged either due to electrostatic charging, ion bombardment, or exposure to ultraviolet (UV) light, thus lowering the yield of the semiconductor wafers.

One approach to decreasing destructive sputtering is to generate the plasma remotely and provide the dissociated atoms to the wafers through a path containing sharp turns. Ions in the plasma collide with the electrodes used to generate the plasma and the chamber wall, but are substantially prevented from reaching the semiconductor wafers by the sharp turns.

A similar approach is described in U.S. Pat. No. 5,217,560 (Kurano). A plasma reactor as described in Kurano is shown in FIG. 2. The reactor comprises an outer reactor tube 11 and an inner tube 12. Gases are supplied through gas pipe 14. Electrodes 15 and 16 create electric fields, E, which cause a plasma to be formed between the outer and inner tubes 11 and 12. Holes 13 allow reactive gases to reach the wafers 17, while ions tend to collide with the inner tube 12.

However, a variety of disadvantages are associated with conventional plasma reactors used for resist removal and the like. First, complex structures may be necessary to isolate the plasma from the wafers. Second, providing atomic radicals to a wafer through a complex path may lead to the non-uniform flux of the radicals to the wafer. This decreases the uniformity of resist removal. Third, capacitive coupling of energy into the plasma drives currents and causes ions to collide with greater energy with the chamber wall and any electrodes in the plasma chamber. This may reduce the lifetime of the reactor (particularly if certain gas additives are used which may be needed for removal of residual chemicals from the "ash" of the resist). This problem is present even when the coupled energy is primarily inductive, since conventional induction coils also capacitively couple energy into the plasma and modulate the plasma potential thereby driving electric currents through the plasma to the nearest metal surfaces. This may cause discharges to barriers used to separate the plasma and the wafer and may limit the effectiveness of any such barriers. If small holes are used in the barrier so few ions can pass through, modulation of the plasma potential may induce hollow cathode discharge in the holes or between the grids. This may actually increase the charged particle current passing through the barrier. Finally, dissociated gases may recombine before reaching the remote wafers, reducing the efficiency of the plasma as a source of atoms.

Thus, what is needed for resist removal and similar processes is a method for producing abundant dissociated atoms without producing excessive ions and without unnecessarily driving RF currents or causing charge buildup at chamber walls, electrodes, or semiconductor wafers. What is also needed is a plasma reactor that is capable of generating a plasma in a chamber and providing neutral activated species to a semiconductor wafer without bombarding the wafer with ions and without necessitating complex structures that degrade wafer processing. Preferably, a plasma with a low or highly localized density of charged particles may be produced, and the majority of those charged particles may be filtered from the neutral activated species before reaching the wafer. What is also needed is a method of inductively coupling energy into a plasma without substantially modulating the potential of the plasma.

SUMMARY OF THE INVENTION

One aspect of the present invention provides a method for inductively coupling energy into a plasma without substantially capacitively coupling energy into the plasma. Another aspect of the present invention provides a split Faraday shield interposed between a plasma and induction coil surrounding the plasma.

It is an advantage of these and other aspects of the present invention that energy may be provided to a plasma without substantially modulating the sheath potential of the plasma and without substantially driving ion currents into a chamber wall or semiconductor wafer. The split Faraday shield allows inductive energy to be coupled into the plasma while substantially preventing the capacitive coupling of energy into the plasma from the induction coil, thereby avoiding modulating the plasma potential.

Yet another aspect of the present invention provides a plasma reactor with a split Faraday shield interposed between a plasma in a reactor and induction coil surrounding the reactor, and also provides a powered electrode in the reactor adjacent to which a wafer or the like may be placed for processing.

It is an advantage of this and other aspects of the present invention that the induction coil may be used to control ion density in the plasma while the powered electrode may be used to substantially independently control ion energies for etching or the like. It is another advantage of this aspect of the present invention that a soft etch may be implemented while commercially viable etch rates are maintained.

Yet another aspect of the present invention provides a method of dissociating molecules in a plasma without substantially capacitively modulating the plasma potential. This aspect of the present invention may be implemented by interposing a split Faraday shield between induction coils and a reactor chamber.

It is an advantage of this and other aspects of the present invention that abundant dissociated atoms may be produced without requiring excessive electron density and without unnecessarily driving currents of charged particles or causing charge buildup at chamber walls, electrodes or semiconductor wafers. It is yet another advantage of this aspect of the present invention that a simple chamber structure may be used for resist removal or the like without substantially sputtering or otherwise damaging semiconductor wafers.

Another aspect of the present invention provides a substrate that is electrically isolated from a ground potential for holding a wafer or the like for processing. It is an advantage of this aspect of the present invention that the amount of RF current drawn to the substrate and wafer is reduced.

Yet another aspect of the present invention provides an electric field for filtering charged particles from an activated species before introducing the activated species to a wafer or the like. Another aspect of the present invention provides one or more grids for filtering charged particles from an activated species. Another aspect provides for inducing an electric field between grids to enhance filtering. Yet another aspect of the present invention provides for blocking UV radiation produced in a plasma from reaching a wafer or the like. This may be implemented by aligning grids so there is no line of sight from the plasma to the wafer.

It is an advantage of these and other aspects of the present invention that wafers or the like may be processed with activated species with reduced exposure to charged particles and UV radiation.

BRIEF DESCRIPTION OF THE DRAWINGS

These and other features and advantages of the present invention will become more apparent to those skilled in the art from the following detailed description in conjunction with the appended drawings in which.

RELATED PATENT APPLICATION

Figure 3:
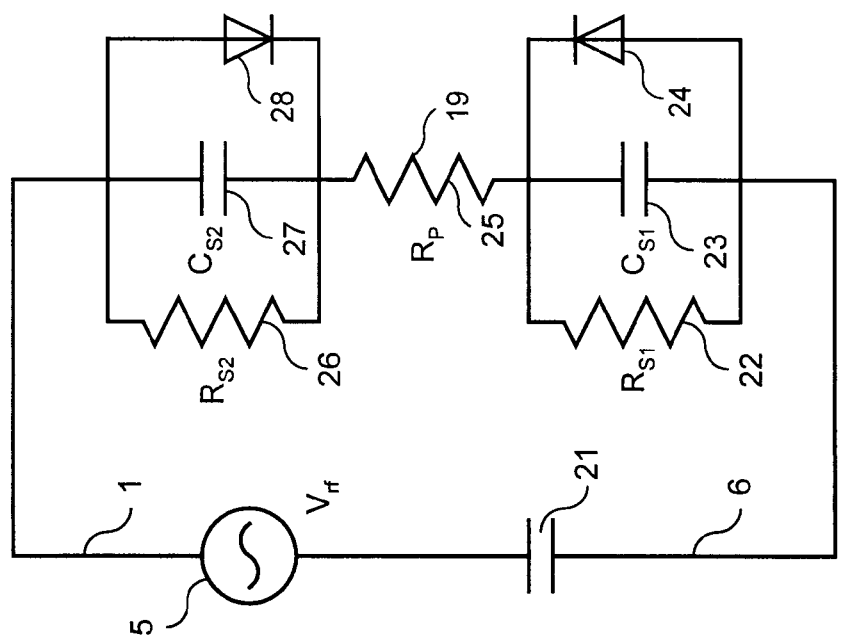
FIG. 3 is an equivalent circuit for a prior art plasma etch reactor in which power is capacitively coupled into the reactor chamber.

The subject matter described herein relating to the plasma reactor of the first embodiment designed primarily for anisotropic ion etch or the like, illustrated with reference to FIGS. 3–8, is described in copending patent application Ser. No. 07/460,707, filed Jan. 4, 1990, in the name of Stephen E. Savas [and assigned of record to the assignee of record of this application]. This patent application and any patents that may issue thereon are expressly Incorporated herein by this reference.

DESCRIPTION

The present invention relates primarily to plasma reactors and methods for processing semiconductor wafers using plasma reactors. The following description is presented to enable any person skilled in the art to make and use the invention. Descriptions of specific embodiments are provided only as examples. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Plasma Reactor Primarily for Anisotropic Ion Etch or the Like

A first embodiment, suited primarily for ion etch processes will now be described. In accordance with the first embodiment, a plasma reactor is presented in which low frequency (0.1–6 MHz) RF power is inductively coupled into the plasma to provide energy for ionization of the gas near a wafer-holding, powered electrode and a high frequency voltage of lower power is applied to the powered electrode to control the ion bombardment energy of a wafer upon this electrode. A wafer is placed on or just above this powered electrode for processing.

This plasma reactor has a nonconductive chamber wall that is encircled by an induction coil that is connected to a low frequency RF source. A split Faraday shield is positioned between the induction coil and the sidewall of the reactor and encircles the reactor to substantially eliminate the conduction of displacement currents between the induction coil and the plasma reactor. This shield, in effect, greatly reduces the capacitive coupling of the low frequency RF electric field to the plasma (see, the article by J. L. Vossen, entitled *Glow Discharge Phenomena in Plasma Etching and Plasma Deposition*. J. Electrochem. Soc. Solid-State Science and Technology, Vol. 126, No. 2, February 1979, p. 319) so that the energy of ion bombardment of the reactor wall and associated etching and sputtering of the reactor wall is substantially eliminated and so that the modulation of the wafer sheath voltage at the low frequency is reduced.

This Faraday shield is movable toward or away from the vessel so that the capacitance between the plasma and the shield can be varied. During wafer processing the Faraday shield is placed substantially in contact with the chamber outer wall, producing a high value of capacitance. This reduces the RF plasma potential, thereby reducing plasma etching of the walls of the reactor. An increased gap between the Faraday shield and the chamber wall yielding a reduced value of capacitance can be used outside of periods of wafer etching to produce increased RF and time-averaged plasma potential levels, thereby causing higher energies of ion bombardment that enable cleaning of the reactor walls with a controlled level of etching. Preferably, the Faraday shield is moved radially to alter capacitance, but the capacitance could also be varied by vertical movement of the Faraday shield. In an embodiment in which the shield is movable vertically, the shield should not be allowed to move far enough vertically that it does not lie between the reactor chamber and every coil of the induction coil. A conductive sheet can also be included above the top of the chamber to increase the capacitance of the plasma to the effective RF ground electrode provided by the reactor wall. This plate can also be movable to vary the capacitance between the plasma body and this portion of the Faraday shield.

A DC magnetic field can be included to enhance ion generation at low pressures by confining electrons away from the walls of the chamber. At low pressure, electrons have an increased mean free path that would increase their rate of loss from the chamber by collisions with the chamber wall. This magnetic field forces the electrons into helical paths that have an increased chance of making ionizing collisions within the chamber before colliding with a wall.

A diverging magnetic field which is stronger near the top of the reactor chamber can be included to reflect electrons back into the plasma, thereby preventing their loss at the top wall of the chamber. This latter magnetic field (which might be as small as several ten thousandths of a tesla near the top of the chamber) can be produced either by an array of permanent magnets positioned on top of the chamber and having alternating directions of the magnetic fields, by a solenoidal coil carrying DC current, or by a ferromagnetic disk.

The inductively coupled RF power is supplied at a frequency in the range 0.1–6 MHz and at a power level up to 10 kw, depending on the size of the reactor chamber. The voltage applied to the powered electrode is at a frequency much higher than the inverse of the average time for an ion to cross the sheath at the powered electrode. Preferred choices for the frequency $f_h$ of this voltage signal are any of the ISM standard frequencies 13.56, 27.12 and 40.68 MHz. The higher frequencies will be needed for higher densities of plasma in order to produce ion bombardment energies which are not too broadly distributed.

The sheath at the powered electrode contains a strong electric field that is substantially perpendicular to the plane of the wafer, thereby producing substantially vertical ion impact and associated substantially vertical or controlled taper etching of the wafer. The amount of capacitively coupled power provided to the powered electrode is substantially less than the power provided inductively to the plasma. Therefore, the average ion current at the wafer is primarily determined by the inductively coupled power and, due to the Faraday shield, the average ion energy at the wafer is substantially a function only of the amplitude of the RF signal to the powered electrode. In contrast to this, in the typical plasma reactor illustrated in FIG. 1, both the average ion density (which is typically somewhat lower) and energy are controlled by the amplitude of the RF signal to the powered electrode. The inductively coupled reactor therefore enables the sheath voltage to be reduced and the ion density to be increased. Also, the sheath voltage and ion density can be separately varied. Consequently, a soft etch at a commercially acceptable etch rate can be achieved that does not damage integrated circuits that are sensitive to ions having high impact energies on the order of or greater than 100 electron volts.

The electromagnetic fields in the inductively coupled plasma reactor can produce a plasma ion density distribution that is very uniform (depending on the shape of the chamber) over the wafer and therefore produces very uniform wafer processing. The inductively generated electric field is substantially circumferential and therefore accelerates electrons substantially parallel to the side wall of the reactor. Because of the conductivity of the plasma, the strength of this electric field decreases rapidly away from the side wall so that electron acceleration occurs primarily in a region near the side wall. As an electron gains speed, its inertia produces a trajectory that may include a succession of elastic collisions with molecules and/or glancing collisions with the sheath at the side wall. Such collisions can kick the electron into the plasma body. This results in significant electron acceleration only near the wall, but also results in ion generation throughout the chamber. The diffusion of these electrons and ions and the radial $\vec{E} \times \vec{B}$ drift of electrons produces near the wafer a radially symmetric ion density that has a very uniform density. A low pressure (typically, on the order of 0.13–3.9 Pascal) is maintained in the reactor chamber to facilitate diffusion of the electrons away from the region where they gain energy near the side wall.

This design is also extremely efficient in coupling power into the production of ions and therefore provides an important advantage over other reactors for wafer processing that is to be performed by the ions in the plasma (see, for example, the article by J. Freisinger et al. entitled *RF-ion source RIM 10 for material processing with reactive gases*. IX International Conference on Gas Discharges and their Applications, Sep. 19–23 1988). The importance of this can be seen from the following. RF power to a plasma produces neutral radicals, ions, free electrons and excitation of molecules and atoms by the free electrons. The vertical etching that is produced by reactive ions is favored in a chamber that channels a high fraction of the inductive RF power into ion production. For excessively high radical concentrations the reaction on the wafer surface of the radicals can be detrimental to the desired fabrication process so that it is also advantageous in many applications to reduce relative to ionization the production of free radicals by the plasma. Therefore, the plasma reactor according to the first embodiment is particularly suitable for reactive ion etch processes and other processes that are either favored by high ion concentration or degraded by significant free radical concentration. This reactor also requires much less capacitively coupled power than conventional plasma reactors. This system utilizes on the order of several hundred watts of RF power to the powered electrode compared to 500–1000 watts for a conventional plasma reactor in which all power is coupled capacitively. This system also provides the ability to control independently the ion current and the ion impact energy.

Figure 1:
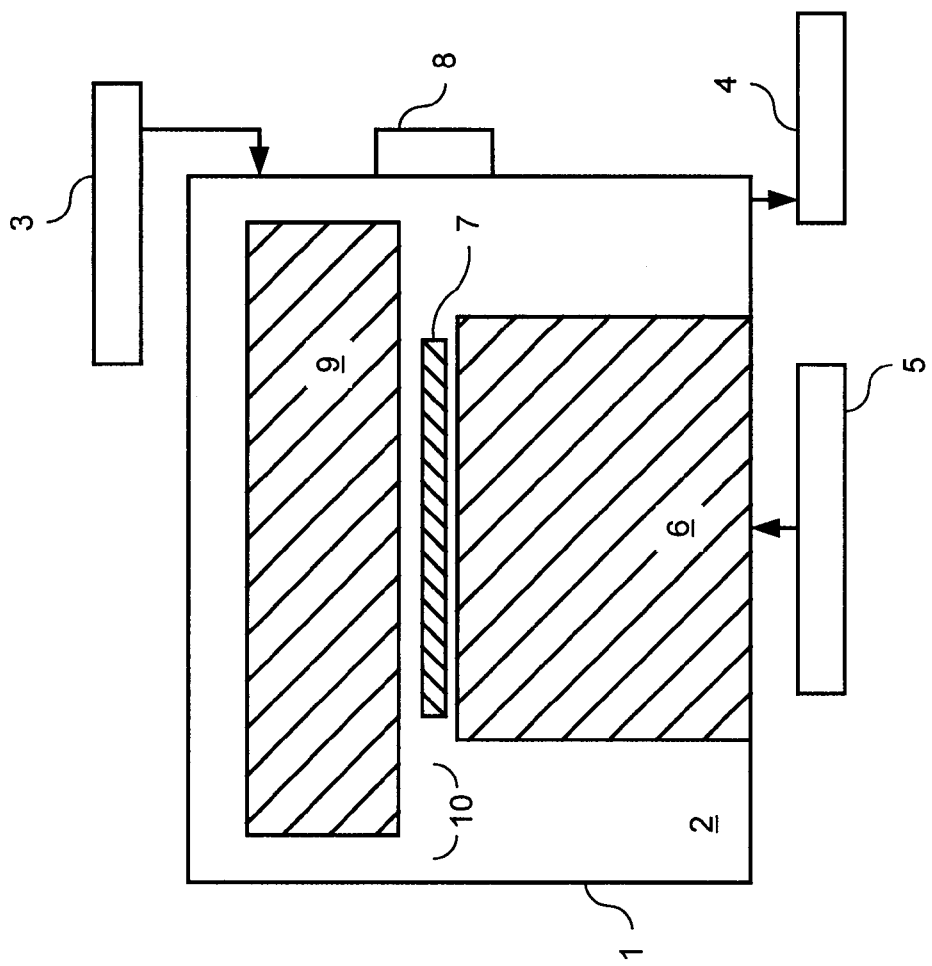
FIG. 1 illustrates the structure of a prior art plasma etch reactor.
Figure 2:
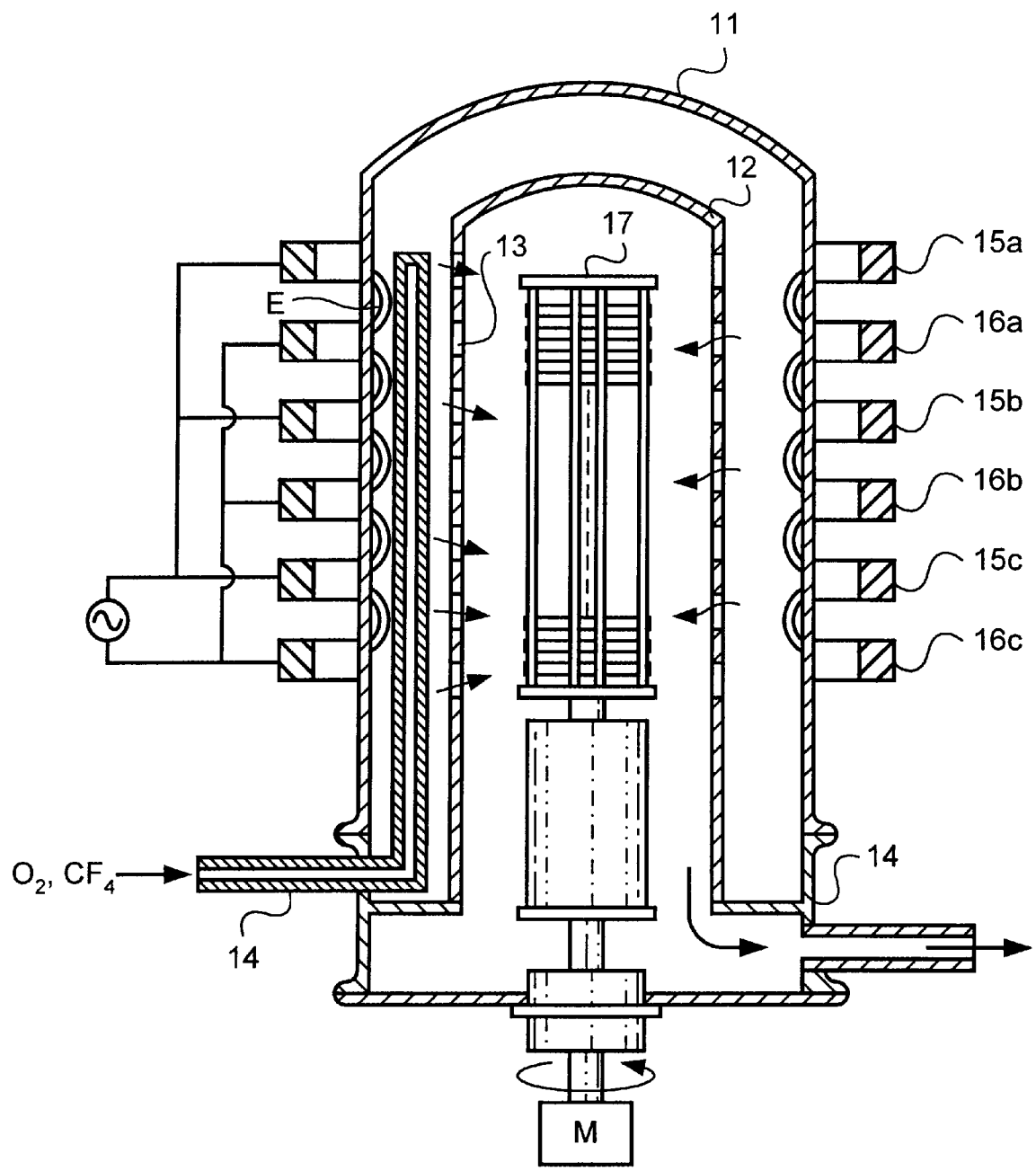
FIG. 2 is a cross-sectional view of a prior art plasma reactor used primarily for ashing.

In the conventional plasma reactor of FIG. 1, the amplitude of the RF signal applied to powered electrode 6 controls not only the ion density in the plasma, but also the sheath voltage of the powered electrode. To achieve a soft etch (i.e., energy of ion bombardment of the wafer on the order of 100 volts or less) the capacitively applied RF power should be reduced below that conventionally used in such a reactor. Unfortunately, this reduction of capacitively applied power would not only reduce the voltage drop across this sheath, it would also reduce the ion density at this sheath. Even at high RF voltage to the powered electrode, such capacitively coupled power produces only a relatively low density of ions. Because the wafer etch rate is proportional to the product of the ion density at this sheath times the voltage drop across this sheath, the wafer etch rate decreases faster than either of these two parameters. Thus, a soft etch produces a reduction in throughput that is incompatible with a commercial integrated circuit fabrication process.

Figure 4:
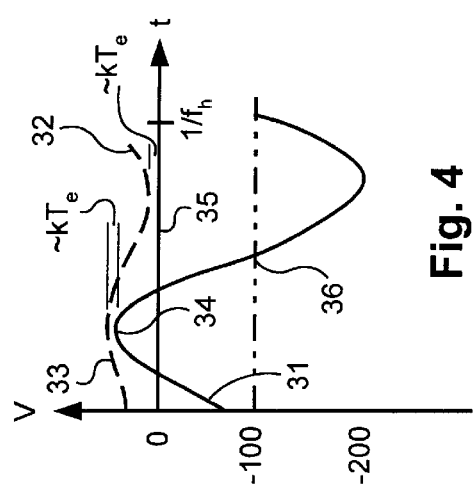
FIG. 4 illustrates the relationship between the RF signal applied to the powered electrode, the voltage $V_p$ of the plasma, and the sheath voltage $V_{dc}$.
Figure 8:
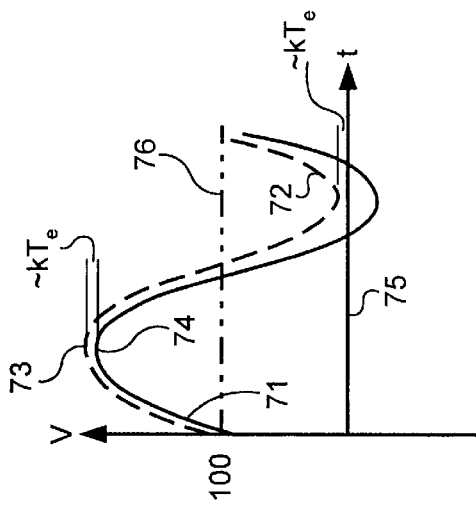
FIG. 8 illustrates the relationship of plasma voltage $V_p$ and the RF voltage applied to the cathode for the case when $C_{s1}$ is much larger than $C_{s2}$ in a reactor according to the first embodiment.

That the sheath voltage in this system is tied to the amplitude of the RF signal applied to the powered electrode can be seen by reference to FIGS. 3 and 4. A capacitor 21 between RF source 5 and powered electrode 6 enables this sheath voltage to have a DC component. This DC component is produced by the combined effects of the unequal areas of the electrodes and the unequal mobilities of the electrons and ions. Each plasma sheath is electronically equivalent to the parallel combination of a resistance, a capacitance and a diode. The electric field across the sheath repels most of the electrons out of the sheath region producing a large sheath resistance on the order of $10^4$ ohms. The capacitive component of the sheath impedance is negligible at very low frequency but with increasing frequency becomes small enough to be significant at about 500 kHz. At frequencies above a few MHz, the sheath resistance is large enough that it can be ignored. This is the case for the high frequency sheath voltage component at the frequency of the capacitively coupled power in the first embodiment.

In the equivalent circuit in FIG. 3, the effects of the much higher mobility of the electrons than the ions in the plasma and sheath is modeled by diodes 24 and 28. Thus, if the plasma were to become negative with respect to any electrode adjacent to the plasma, the electrons in the plasma would see an effective short to that electrode. The sheath impedances are therefore modeled by elements 22–24 and 26–28. The plasma body can be modeled as a low impedance resistance 25 that can be ignored at the high frequency $f_h$ (preferably one of the ISM Frequencies 13.56 MHz, 27.12 MHz or 40.68 MHz) utilized for the RF voltage applied to the powered electrode.

FIG. 4 illustrates the relationship between a 220 volt peak-to-peak RF signal 31 of frequency $f_h$ applied to the powered electrode, the resulting voltage 32 of the plasma and the sheath voltage 36 of the powered electrode. The sheath capacitances $C_{s1}$ and $C_{s2}$ dominate at the frequency $f_h$ of the capacitively coupled power so that resistances $R_{s1}$ and $R_{s2}$ can be ignored and diodes 24 and 28 can be ignored except for a short interval during each period of signal 31. Therefore, under most operating conditions, the plasma equivalent circuit reduces to a capacitive divider so that the plasma potential $V_p$ and the high frequency components of the voltages across capacitances $C_{s1}$ and $C_{s2}$ are substantially in phase and related in magnitude by $V_p = V_{RF} \cdot C_{s2}/(C_{s1}+C_{s2})$.

For a typical reactor with a wall area several times that of the powered electrode, the sheath capacitance $C_{s2}$ at the wall is on the order of 10 times the sheath capacitance $C_{s1}$ at the powered electrode. Therefore, for a 220 volt peak-to-peak RF signal 31, the plasma potential $V_p$ is on the order of 20 volts peak-to-peak. Because signals 31 and 32 are in phase, a peak 33 of signal 32 is aligned with peak 34 of signal 31. Because of diode 24, the minimum voltage difference between signals 31 and 32 (occurring at each peak 34) is on the order of $kT_e/e$. Similarly, $V_p$ must also be at least $kT_e/e$ more positive than ground 35 to avoid shorting the plasma to the walls of the reactor. These various requirements produce an average sheath voltage 36 of the powered electrode (i.e., the DC component of RF signal 31) of approximately −90 volts. The DC component of the sheath voltage is substantially equal to $-V_{RF}C_{s1}/(C_{s1}+C_{s2})/2$ where $V_{RF}$ is the peak-to-peak magnitude of the RF voltage. The sheath voltage varies directly with the magnitude of the RF signal because the electric field component of the RF signal is substantially perpendicular to the powered electrode. This means that the DC component 36 of voltage 31 is directly tied to the peak-to-peak amplitude of the RF voltage applied to the powered electrode.

The ionic current density at the powered electrode of a conventional plasma reactor is proportional to the ion density in the plasma which in turn decreases with decreasing power so that if the RF voltage amplitude is decreased to decrease the sheath voltage, then the current density also decreases. Therefore, the plasma reactor of FIG. 1 does not enable the current density at the wafer to be increased to maintain etch power when the voltage is decreased to produce a softer etch.

The voltage drop across the sheath at the powered electrode is equal to the difference between the applied RF signal 31 and the voltage 32 of the plasma. This voltage drop varies from about 0 volts to about −220 volts. If an ion were to cross this sheath in a time interval that is short compared to the period $1/f_h$ of the RF signal, then its bombardment energy could be almost zero if it crossed the sheath near a peak 34 of RF signal 31. Such low energy bombardment ions would not necessarily have trajectories substantially perpendicular to the plane of the wafer and therefore could degrade the desired vertical etch of the wafer. It is therefore important for the period $1/f_h$ to be no more than half as large as the average time for an ion to cross this sheath. Since this transit time is on the order of or less than a half microsecond, $f_h$ should be at least 4 MHz. For higher ion densities and low sheath voltage, the period $1/f_h$ can be as small as 0.1 μs or less. Because of the less stringent limitations on ISM frequencies, it is preferred that $f_h$ equal one of the ISM frequencies 13.56 MHz, 27.12 MHz or 40.68 MHz.

Figure 5:
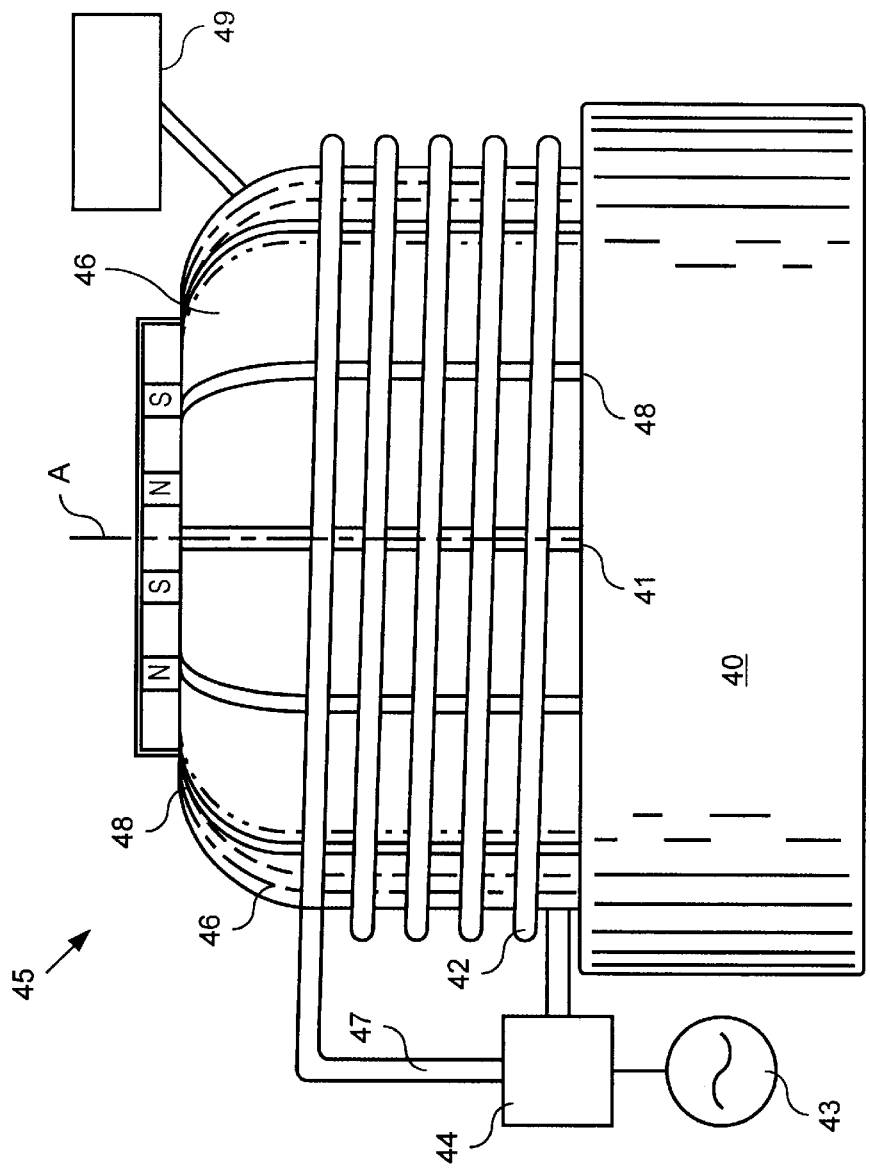
FIG. 5 is a side view of an inductively coupled reactor according to a first embodiment of the present invention.

In FIG. 5 is a plasma reactor according to a first embodiment of the present invention that allows independent, controllable variation of the sheath voltage and the ion current density at the wafer. This reactor also produces a very uniform distribution of ion current density and voltage at the wafer and can provide an increased ratio between ion and free radical production rates in the plasma relative to purely capacitive or higher frequency inductive discharges. This system is therefore particularly useful for applications, such as ion etch processes, in which an increased ratio of ions to free radicals is advantageous.

Figure 6:
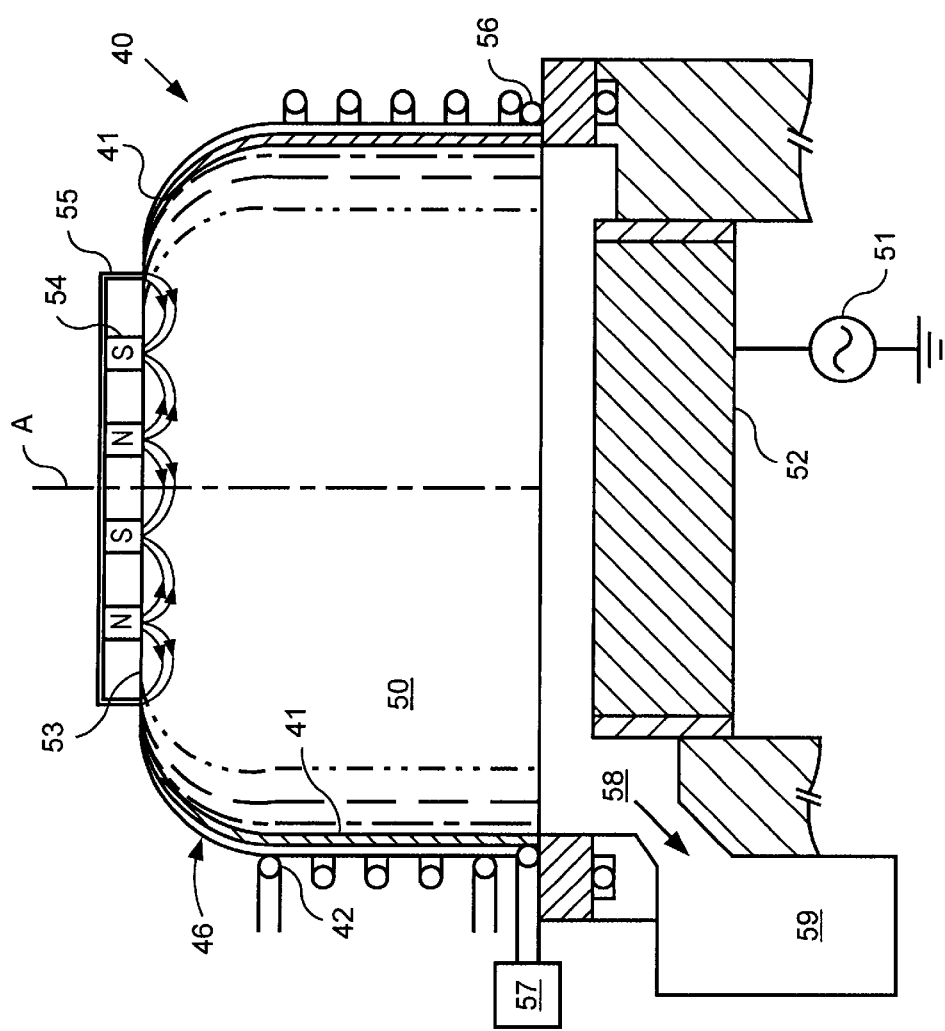
FIG. 6 is a cross-sectional side view of an inductively coupled reactor according to the first embodiment of the present invention.

On a base 40 is a cylindrical chamber wall 41 that encloses a plasma reactor chamber 50 (shown in FIG. 6). Chamber wall 41 is on the order of 7–30 centimeters high and has a lateral diameter that is dependent on the diameter of the wafers that are to be processed. For a 15 cm diameter wafer processing system, this chamber wall has a lateral diameter on the order of 25–30 centimeters and for a 20 centimeter diameter wafer processing system, this chamber has a lateral diameter on the order of 30–38 centimeters. Chamber wall 41 is made of a nonconductive material such as quartz or alumina.

Encircling wall 41 is an induction coil 42 that is connected to a first RF source 43 through a conventional impedance match network or transformer 44. This coil has a number of turns (on the order of 1–30 turns) to produce an inductance that can be conveniently matched to RF source 43 by a conventional match network 44 utilizing commercially convenient capacitor values or by a transformer to match the inductive impedance (typically, equal to or less than 10 ohms) to the impedance (typically, 50 ohms) of source 43. The match network is designed to substantially eliminate the reflection of power back to source 43. This induction coil produces within chamber 50 an axially symmetric RF magnetic field whose axis is substantially vertical and an electric field that is substantially circumferential. Both of these fields exhibit a rotational symmetry about a central axis A. This rotational symmetry contributes to the uniformity of wafer processing.

Because of the high conductivity of the plasma, the inductively coupled fields are substantially limited to a region adjacent to the side wall of skin depth δ (on the order of a centimeter) proportional to the square root of the electron density in the plasma divided by the frequency $f_i$ of the inductively coupled RF field. For larger systems, $f_i$ can be reduced to increase the thickness of this region within which electrons are accelerated.

Within this region, the circumferential electric field accelerates the electrons circumferentially. However, because of the inertia of these accelerated electrons, they may experience glancing collisions with the electric field of the sheath at the sidewall. Such collisions will reflect most of these electrons away from the wall. Some of these electrons will strike the side wall and may produce secondary electrons. Elastic collisions with gas molecules cause the electrons to diffuse throughout the volume of the chamber. Because the inductively generated electric field is limited to the distance δ (the resistive skin depth) from the side wall, electron heating is limited to this region. In order to enhance the uniformity of ion density across the wafer, the pressure is kept low (typically 0.13–3.9 pascal) so that the electrons heated near the wall can rapidly diffuse away from the wall to produce a very uniform ionization and resulting ion density across the wafer surface.

The reactor radius R, the frequency $f_i$ and the power of the inductively coupled power are selected to produce a circumferential electric field having a peak-to-peak amplitude on the order of 1–10 volts/cm. This results in an oscillatory electron path of amplitude on the order of or greater than 3 cm so that the mean free path of these electrons is on the order of or less than the amplitude of their oscillatory motion. Source 43 provides power at a frequency in the range 0.1–6 MHz and at a power of up to 10 kW.

A second RF source 51 (shown in FIG. 6) provides RF power to a powered electrode 52, preferably at one of the ISM (Industry, Scientific, Medical) standard frequencies (i.e., 13.56 MHz, 27.12 MHz or 40.68 MHz). As in the embodiment of FIG. 1, this RF power produces a DC sheath voltage next to the powered electrode 52. The power level is in the range from less than 100 watts to a few (up to 5) hundred watts so that the effect of this capacitively coupled RF signal on the ion density is much less than the effect of the power inductively coupled from source 43. This power level is somewhat less than that typically provided to the powered electrode in a plasma reactor. This power level can be kept low to produce a soft (i.e., kinetic energy less than 100 eV) bombardment of the wafer by ions. This low power level to the powered electrode also means that the ion density is determined primarily by RF source 43. This is advantageous in decoupling control of the ion density and the sheath voltage.

The circumferential direction of the inductively generated electric field makes this field parallel to the powered electrode so that a path integral from the plasma body to the powered electrode along a normal to the powered electrode is zero. As a result of this, unlike in the plasma reactor of FIG. 1, there is no RF component across the sheath producing an RF time varying potential difference between the plasma body and the powered electrode. This substantially eliminates coupling of the low frequency induced RF field to the potential of the powered electrode. Therefore, the sheath voltage of powered electrode 52 is determined only by RF source 51.

Enclosing the side wall of the reactor is a grounded Faraday shield 45 consisting in this embodiment of a dozen conductive plates 46 that conform to the side wall. Each Faraday shield conductive plate 46 is spaced from its neighboring plates by gaps 48. These gaps are needed to enable the induction RF magnetic field to penetrate within reactor chamber 50. At least one gap is needed to prevent the formation of a circumferential current in the Faraday shield. By Lenz's law, such a circumferential current would strongly oppose variation of the magnetic field within reactor chamber 50, thereby substantially countering the desired action on reactor chamber 50 of the current in coils 42.

This Faraday shield also provides the same functions as the grounded conductive walls of the reactor of FIG.

1—namely, it confines the capacitively coupled RF fields to the reactor chamber 50 so that they do not stray outside of the chamber and interfere with other equipment or violate federal radiation standards. This shield also provides a return path for the high frequency current from the electrode produced by capacitively coupled power supply 51.

Faraday shield 45 can, when positioned next to the reactor wall, significantly reduce the amount of time variation of the plasma potential $V_p$ at the RF frequency $f_i$ of source 43. This is important in decoupling the effects of the first RF source 43 and the second RF source 51 on the ion density and the average sheath voltage $V_{dc}$. At the power levels applied to coils 42, the large inductance (on the order of 1–100 microhenrys) of these coils produces a large voltage at one or both ends of these coils. If the Faraday shield were absent, then the high voltage end 47 of coil 42 would couple capacitively to the plasma body and impress an RF variation of $V_p$ at the frequency $f_i$ of source 43 (see, for example, J. L Vossen, *Glow Discharge Phenomena in Plasma Etching and Plasma Deposition*, J. Electrochem. So.: Solid-State Science and Technology, Vol. 126, No. 2, p. 319).

The widths of gaps 48 are less than the minimum spacing between these plates 46 and coils 42 so that coils 42 do not significantly couple capacitively through these gaps to the plasma body (see the Vossen reference). If such capacitive coupling to the plasma body were not blocked, this RF variation of $V_p$ would show up as a variation of the sheath voltages (and hence, ion energy) at this same frequency. Furthermore, this electric field could degrade the symmetry of the etch if it were not substantially excluded by the Faraday shield.

Faraday shield 45 also significantly influences the value of the sheath capacitance $C_{s2}$ for the plasma sheath adjacent to the wall 41 of the plasma reactor. If this Faraday shield were not present, then the effective ground for the capacitively coupled RF signal would be provided by the RF induction coil or the environment surrounding the reactor chamber and therefore would be dependent on what other objects were near the reactor. Furthermore, these objects would generally be at a distance that is large enough that the effective ground could be treated as being at infinity. This makes $C_{s2}$ for the side and top walls more on the order of or less than one tenth of $C_{s1}$ instead of ten times $C_{s1}$ as was the case for FIG. 4. The result is that the relationship between the plasma potential $V_p$ and the RF signal is more like that shown in FIG. 8 than like that shown in FIG. 4.

In FIG. 8, it is again assumed that the RF voltage (signal 71) has a peak-to-peak amplitude of 220 volts. For $C_{s1}$ equal to ten times $C_{s2}$, the plasma voltage signal 72 has a peak-to-peak amplitude of 200 volts. The peaks 73 of the plasma voltage VP again align with the peaks 74 of the RF voltage signal 71 and the spacing between these peaks is again up to several times $kT_e/e$. Likewise, the spacing of the troughs of $V_p$ from ground is on the order of $kT_e/e$ (which is typically a few volts). The plasma voltage signal 72 therefore has a DC component 76 on the order of 100 volts. This contrasts with FIG. 3 where the plasma voltage signal 32 has a DC component on the order of 10 volts plus an offset of order $kT_e/e$.

This greatly increased DC component between the wall and the plasma body results in an unacceptable level of etching or sputtering of the wall by ions in the plasma. Such action not only damages the chamber wall, but also uses up reactant gas and can inject into the plasma contaminants that can interfere with the wafer fabrication processes in the reactor chamber. However, with the Faraday shield 45 closely spaced from wall 41, the effective ground electrode capacitance is increased and $C_{s2}$ is again several times larger than $C_{s1}$ so that the relationship between the RF signal and the plasma voltage $V_p$ is like FIG. 4 instead of like FIG. 8. Indeed, normally, the spacing between the "plates" (i.e., the plasma and the conductive wall) of the capacitance $C_{s2}$ is on the order of 0.1 cm. For the reactor of FIG. 5, when the Faraday shield is closely spaced from wall 41, the capacitance $C_{s2}$ is increased by the thickness of wall 41 divided by the dielectric constant (which is >4), which is equivalent to a vacuum gap of 0.075 cm. Therefore, the wall capacitance $C_{s2}$ is a little more than half of what it would be for a reactor of the type shown in FIG. 1 of comparable dimensions to that in FIG. 5.

Plates 46 are movable radially on the order of or more than 1 cm so that capacitance $C_{s2}$ can be substantially decreased by moving plates 46 away from the walls to vary the ratio $C_{s1}/C_{s2}$ over a range on the order of from 0.1 to 10. These plates are moved close to wall 41 during wafer processing so that etching of the chamber wall and the associated production of contaminants are minimized. In periods other than wafer processing periods, the plates can be moved away from the wall by as much as a cm or more to provide a controlled period of etching of the wall to clean the wall. The remnants of this chamber cleaning step are then drawn out of the reactor before further wafer processing is implemented.

Figure 7:
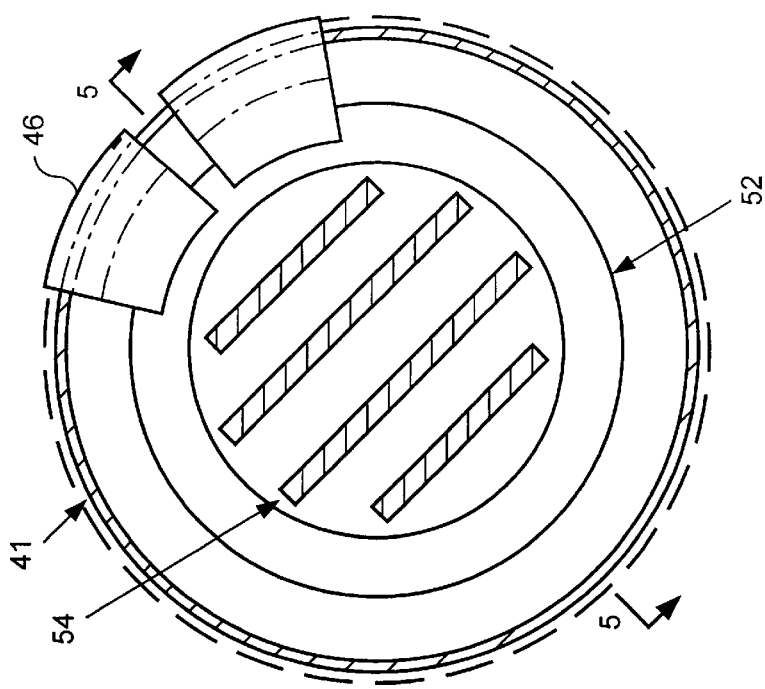
FIG. 7 is a top view of the reactor according to the first embodiment of the present invention.

FIGS. 6 and 7 are respectively side cross-sectional and top views of the reactor according to the first embodiment illustrating further optional features of this reactor. Just outside of the top of reactor chamber 50 is a grounded conductive plate 53 that provides for the top of reactor chamber 50 substantially the same function as Faraday shield 45 provides for the sides of this chamber.

On top of the reactor chamber are a set of magnets 54 that alternately orient their north poles downward. A ferromagnetic return plate 55 helps return the flux of the fields produced by the two outermost magnets. The magnets preferably are permanent magnets since this type of magnet economically provides a sufficient magnetic field. This arrangement produces at the top of chamber 50 an array of alternating direction magnetic fields of about 0.01 tesla that act like magnetic mirrors to reflect electrons back toward the plasma body. The fields from these magnets penetrate into the reactor chamber a distance on the order of twice the spacing (on the order of 2–3 cm) between these magnets. In other embodiments, this linear array of magnets could be replaced by a set of concentric ring magnets, again having north poles of successive magnets oppositely oriented vertically. In still other embodiments, a flat disc of ferromagnetic material having its north pole oriented vertically or a single ring DC solenoid could be used to produce a single genetic mirror, which may have a magnetic field as low as several ten thousandths of a tesla near the top of the chamber. The embodiment utilizing a magnetic disc is preferred because it is simple, inexpensive and preserves radial symmetry of the reactor. In contrast to this, the lack of radial symmetry of the magnetic fields from the magnets 54 in FIG. 6 will slightly degrade the radial symmetry of wafer etch.

Just outside of the base or top of reactor wall 41 is a conductive coil 56 connected to a DC current source 57 to produce an optional DC magnetic field to further contain electrons away from the side wall. The magnitude of the magnetic field from this coil can be on the order of 0.0001–0.01 tesla.

The plasma reactor of FIGS. 5–7 provides significantly improved operation compared to many other existing reactors. Whereas a conventional plasma reactor using a microwave source may produce only a few milliamps/cm² current density, the reactor according to the first embodiment may produce up to 50–100 milliamps/cm². Tests show that this high current results for a variety of reactant gases, such as $SF_6$, $CF_2Cl_2$, $O_2$ and argon. This indicates that relatively more of the power is going into the production of ions instead of into the production of neutral fragments as in other plasma production methods at pressures above 1 millitorr. These neutral fragments would not contribute to this current. This is important for etching because only the ions are given the perpendicular direction of impact on the wafer that results in the formation of substantially vertical walls. The ability to produce a very low sheath voltage at the wafer means that a 400 nm thick gate of polysilicon can be etched vertically without damage to or etching of an underlying 10 nm thick $SiO_2$ gate insulator by reducing the sheath voltage to less than 20–30 volts.

The reactor according to the first embodiment includes a gas source 49 and an exhaust port 58 that is part of an exhaust system 59 that includes a pump to exhaust plasma process products and to keep the pressure to a selected level. Typically, the pressure is held at on the order of 1–30 millitorr pressure to enhance diffusion of electrons from the electron heating region near the side wall into the bulk volume. Even at this pressure, the inductively coupled power is primarily coupled into production of ions. In contrast to this, other plasma systems such as the microwave plasma systems produce relatively more free radicals at pressures above approximately 1 millitorr. If a microwave plasma reactor is to primarily produce ions, then the pressure needs to be on the order of or less than a few tenths of a millitorr. This requires that reactor pumps have speeds greater than a few torr-liters per second. This large rate of pumping requires either the use of cryogenic pumps closely coupled to the reactor chamber or very large turbo pumps with large ports to the chamber. In contrast, the reactor disclosed herein can operate at higher pressures and requires a pump speed only on the order of a few hundred millitorr-liters per second. This is easily achieved with smaller pumps which need not clutter the space around the chamber and interfere with wafer handling or other essential chamber peripherals. Such pumps also would no. require regeneration or pose a safety hazard as do cryogenic pumps.

Plasma Reactor Primarily for Resist Removal or the Like

Techniques similar to those described above may be used to produce abundant dissociated radicals for resist removal or the like. Whereas the above described reactor is configured to promote the production of ions for etching, a reactor for resist removal is preferably configured to promote dissociation and minimize ionization. Thus, according to a second embodiment of the present invention, a plasma reactor is provided for the efficient dissociation of molecules for use in resist removal or similar processes.

At a general level, the structure of a reactor for dissociation according to the second embodiment is similar to the reactor for ion etching according to the first embodiment as described above. Induction coils surround a reactor chamber and inductively couple energy into the chamber to produce a plasma. Electrons are accelerated circumferentially within the plasma by the induction electric field causing collisions with molecules. These collisions result in excited molecules, dissociated atoms, and ions. Higher energy collisions tend to produce ionization, while lower energy collisions result in excitation and dissociation. In particular, electron energies in the range of 11–12 eV are typical for the threshold for ionization of oxygen gas, while electron energies of 5–6 eV are typical for the threshold for dissociation.

The electron energies depend upon the strength of the electric field which accelerates the electrons and the density of the gas which determines the mean distance over which electrons are accelerated between collisions. For an ion etch reactor, a higher power is applied to the induction coil to increase the induction electric field, and a lower gas pressure is used which allows electrons to accelerate with fewer collisions and attain the energies necessary for ionization. For a plasma reactor used for dissociation, a lower power and higher pressure and flow are used.

Figure 9:
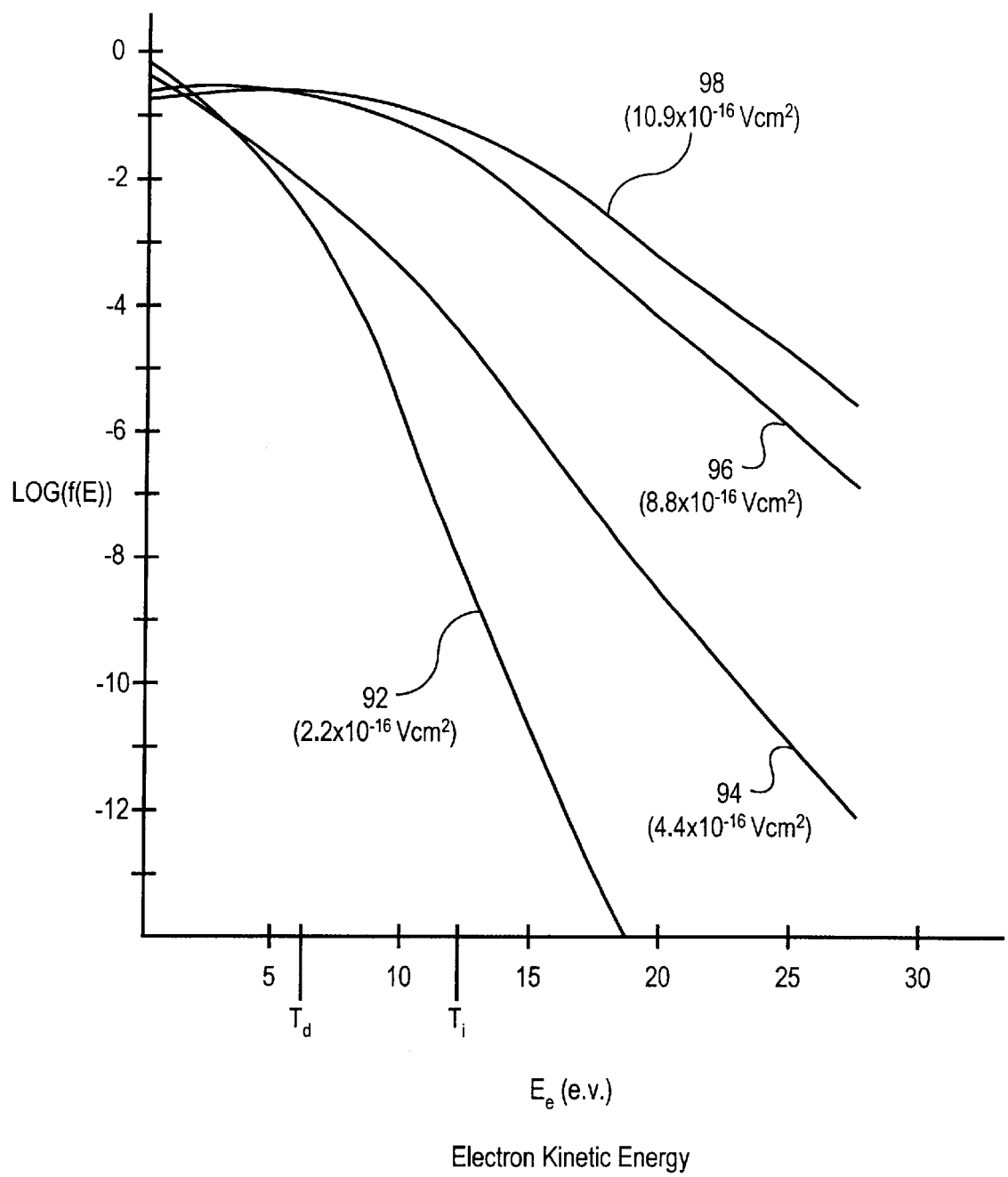
FIG. 9 is a graph illustrating the electron energy distribution for various values of $E/N_g$.

The effect of varying the electric field and density of gas on the distribution of electron energies in a plasma is illustrated in FIG. 9. The electron energy distribution, $f_e(E)$, is a function of the electric field, E, divided by the number density of the gas, $N_g$. In the graph in FIG. 9, the distribution of electrons at various energies is shown for different values of $E/N_g$ (in a 90% $O_2$ and 10% O gas). Electron energy is plotted along the x axis and $\log_{10}$ of the electron density is plotted along the y axis. Along the x axis, $T_d$ indicates the threshold energy for dissociation (~5–6 eV), while $T_i$ indicates the threshold for ionization (~12 eV). Curve 92 shows the distribution for $E/N_g \sim 2.2 \times 10^{-16}$ Vcm². This may represent an electric field of 14 V/cm and a density of $6.4 \times 10^{16}$/cm³. Curve 94 shows the distribution for $E/N_g \sim 4.4 \times 10^{-16}$ Vcm². Curve 96 shows the distribution for $E/N_g \sim 8.8 \times 10^{-16}$ Vcm². Curve 98 shows the distribution for $E/N_g \sim 10.9 \times 10^{-16}$ Vcm². Curves 92–98 show that the number of electrons having energies greater than $T_i$ decreases as $E/N_g$ decreases. The electron energy distribution of curve 98 leads to a significantly higher ion density than the distribution curve 92.

Thus, it can be seen that the level of energy coupled into the plasma and the pressure are two important variables in determining the composition of the plasma. In the first embodiment, a low pressure is used (1–30 millitorr) with a relatively high level of RF power applied to the induction coil (up to 10 kW). This provides a relatively high level of ionization. For the second embodiment, a higher pressure (approximately 1–2 torr) and lower level of RF power (approximately 500–1500 watts) are used. This favors dissociation over ionization relative to the first embodiment. Preferably, in the second embodiment, only enough ionization occurs to sustain the plasma and continue the dissociation of atoms. In the second embodiment, a typical value for the electric field, E, is approximately 40 V/cm at the highest point in the reactor chamber and a typical value for the density of the gas, $N_g$ is approximately $10^{16}$/cm³ to $10^{17}$/cm³. $E/N_g$ is preferably no greater than approximately $10^{-15}$ Vcm² and the peak ion density at the center of the plasma is preferably on the order of $10^9$/cm³.

As in the first embodiment, a split Faraday shield is used to substantially prevent the capacitive coupling of energy into the plasma and to greatly reduce modulation of the plasma potential thus permitting the plasma to be restricted to the volume within the induction coil. In the first embodiment, the split Faraday shield is desirable, because it allows a second mechanism (the powered electrode) to independently control the energies of ions bombarding and etching the wafer. In resist removal and similar processes, however, charged particle flux is undesirable, and may damage or drive impurities into the surface of the wafer. Thus, in the second embodiment, ion density is reduced and there is no powered electrode accelerating ions toward the wafer. The split Faraday shield is important for reducing electric current flux to the wafer and reactor walls due to capacitive coupling from the induction coil and to keep the plasma confined to the region inside the coil where it is produced.

As described above, the split Faraday shield only allows the induction coil to generate an induction electric field in the plasma. Any capacitive electric field between the plasma and the induction coil—which would drive current toward the chamber wall and modulate the potential of the plasma— is substantially blocked by the split Faraday shield. The induction electric field accelerates electrons circumferentially. This provides the energy for electrons causing dissociation and ionization, but does not accelerate ions directly at the chamber wall. Further, the induction electric field does not cause charge build up in the plasma, which would modulate the plasma potential and drive currents into the wafer. This can be seen from Maxwell's equations on electromagnetism as set forth in Table 1.

TABLE 1

(1) $\nabla \times \vec{E}_i = -\partial \vec{B}/\partial t$
(2) $\nabla \cdot E = \rho/\epsilon_0$ According to equation (1), the curl of the induction electric field, $E_i$, is given by the time rate of change of the magnetic field. This cannot be zero, because the induction coil induces a time varying magnetic field. This in turn means that the induction electric field cannot be the gradient of any potential, because if the induction field was the gradient of some potential the curl would be zero in contradiction of equation (1). Equation (2) shows that for an electric field derived from a potential the dot product is equal to the charge concentration, $\rho$, over the permittivity constant, $\epsilon_o$. Since the induction electric field cannot be the gradient of any potential, it follows from equation (2) that the induction electric field cannot result in any charge buildup inside the plasma. Therefore, the induction electric field does not induce any temporal modulation in the plasma potential.

Several advantages are realized from using an inductive electric field for sustaining the discharge while blocking any capacitively induced electric field. First, since the induction electric field is circumferential and no bias on the chamber wall is induced, ion bombardment of the chamber wall is reduced and occurs at lower energy. This extends the life of the reactor, and is particularly important when certain additives are used to enhance resist or film removal. For instance, halogenated gases, such as $SF_6$, $Cl_2$, $CHF_3$, $CF_4$, $C_2F_6$, CFC's, or the like, may be added to oxygen in small concentrations to affect the chemistry of the reaction that strips the film off the wafer and removes residue from the wafer. If a capacitive electric field causes bombardment of the chamber wall, these additives may quickly erode the chamber wall. Since a split Faraday shield is used to substantially block the capacitive electric field in the second embodiment, additives may be used with less substantial erosion of the reactor. Second, the plasma potential is minimally modulated and the electric field at the wafer surface can be kept small. This reduces the charged particle current driven into the wafer surface which may damage the wafer. Third, since the plasma potential has reduced RF modulation, the plasma can be substantially confined to a portion of the chamber away from the wafer surface. The complex structures used in the prior art for segregating the plasma and the wafer are not used in the reactor according to the second embodiment. This allows unimpeded diffusion of dissociated atoms across the wafer surface, which provides more uniform stripping of the resist or other film. However, as discussed below, a system of grids between the plasma and the wafer may be used in an alternative embodiment to additionally filter charged particles and UV radiation.

Figure 10:
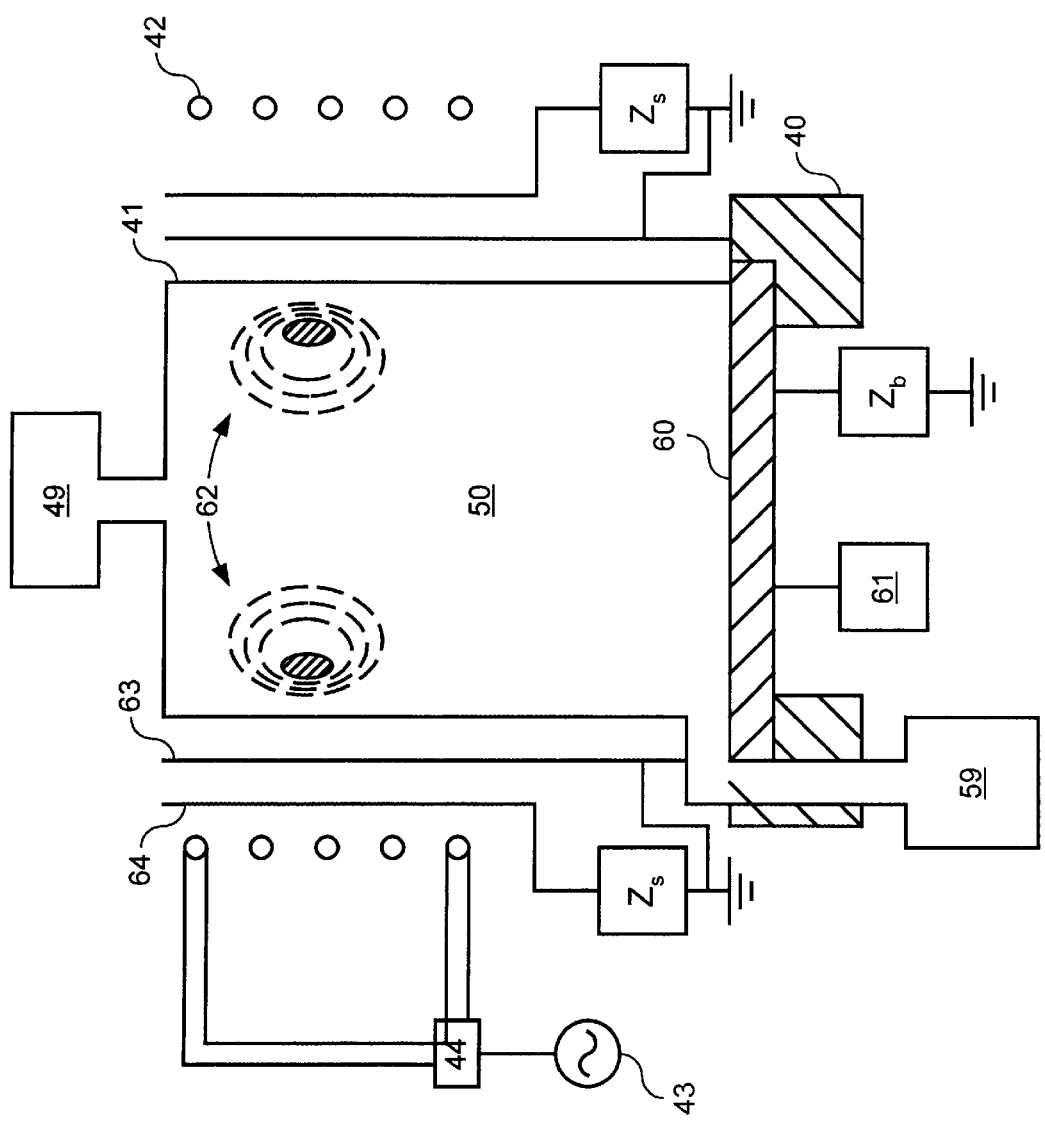
FIG. 10 is a side cross-sectional view of a reactor according to a second embodiment of the present invention.

The structure and operation of the plasma reactor according to the second embodiment will now be described. FIG. 10 shows a side cross-sectional view of a reactor according to the second embodiment. On a base 40 is a cylindrical chamber wall 41 that encloses a plasma reactor chamber 50. A cylindrical or hemispherical chamber is preferred when a circumferential induction field is used, since it reduces the collisions between ions and the chamber wall. Chamber wall 41 is about 30 cm high and has a lateral diameter that is dependent on the diameter of the wafers that are to be processed. Chamber wall 41 is made of a nonconductive material such as quartz or alumina.

It should be noted that the structure of reactor chamber 50 allows dissociated gases to flow and diffuse directly from the plasma to a wafer or other substrate at the bottom of the chamber. This may enhance the uniformity of stripping. Prior art reactors which separate the plasma from the wafer with walls or tubes typically exhibit a uniformity in the range of five to ten percent (meaning that the amount of stripping on one portion of the wafer is within five to ten percent of the stripping on other portions), while the second embodiment of the present invention may provide a uniformity of a few percent when used in common stripping processes. However, as described below, in an alternative embodiment a grid system may be used to filter charged particles without an appreciable reduction of uniformity.

Figure 11A:
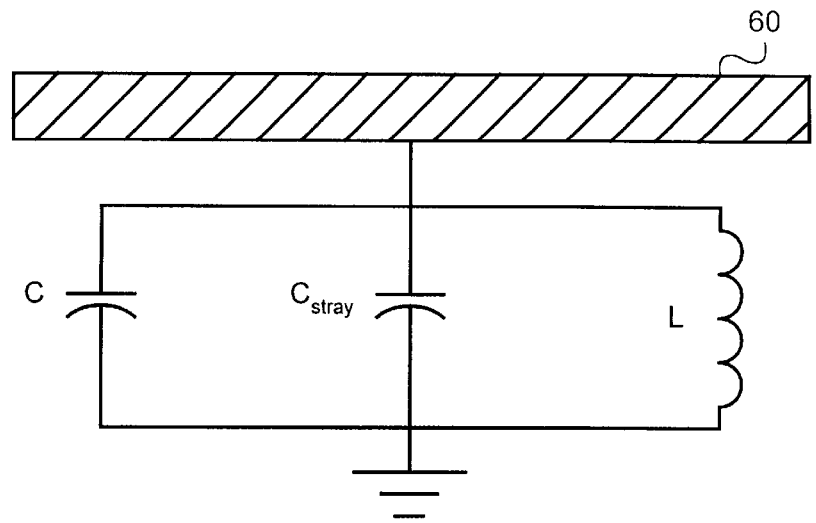
FIG. 11A is a circuit used to provide an impedance $Z_b$ in the reactor of the second embodiment.

At the base of the reactor chamber is an aluminum block 60 or pedestal for supporting a wafer for processing. The block may be maintained at an elevated temperature, such as 250° C., to enhance ashing. A heating unit 61 may be used to heat the block in a conventional manner. It is also desirable to minimize the electric field between the plasma and the wafer surface to reduce the charged particle current driven into the wafer. Therefore, the potential of the aluminum block 60 supporting the wafer is maintained at near the same potential as the volume of the chamber directly above the wafer. This is accomplished by placing an element, $Z_b$, between the aluminum block and a ground potential producing a high impedance of the block to ground at the frequency of excitation. The aluminum block is substantially free to float at the chamber potential. The impedance, $Z_b$, is selected to be very high given the frequency of the RF power coupled into the plasma. As shown in FIG. 11A, the impedance $Z_b$ is preferably provided by a parallel LC circuit inserted between the aluminum block and a ground potential. The capacitance C is chosen taking into account stray capacitance $C_{stray}$ between the aluminum block and the other elements of the plasma reactor chamber. When RF power is provided at a frequency of 13.56 MHz and at a power of between 500 and 1500 watts, the inductance L is preferably on the order of less than 1 microhenry and the capacitance C is preferably on the order of several hundred picofarads.

Encircling wall 41 is an induction coil 42 that is connected to an RF source 43 through a conventional impedance match network 44, as described previously for the first embodiment. This coil preferably surrounds only the top half of the reactor, so that a plasma can be generated and confined to this region. The bottom portion of the reactor chamber acts as a diffusion region where dissociated gas from the plasma may diffuse uniformly across the wafer surface.

This induction coil produces within the top portion of chamber 50 an axially symmetric RF magnetic field whose axis is substantially vertical and an induction electric field that is substantially circumferential. Both of these fields exhibit a rotational symmetry about a central axis. In this configuration, the plasma 62 is concentrated in the shape of what approximates an annular toroid near the top of the reactor chamber. It will be understood, however, that the electric fields are not completely symmetrical and in fact are stronger near the reactor chamber wall than in the center of the reactor chamber. The electric field and density of the plasma reach a peak in the center of the annular toroid. The rotational symmetry contributes to the uniformity of wafer processing.

In the second embodiment, RF energy is applied to the induction coil from source 43 at a frequency of 13.56 MHz and at a power of between 500 and 1500 watts. Of course, a wide variety of frequencies may be used. The number of turns of the induction coil and the current may be adjusted for a given frequency so that the desired induction electric field is produced inside the reactor chamber. In the second embodiment, a peak induction electric field of approximately 40 volts/cm is preferred.

For oxygen based stripping, frequencies from 1 to 27 MHz may be used. Even lower frequencies, possibly as low as 100 kHz, might be used if a very large number of turns, on the order of 20 or 30, were used in the induction coil with a large current, perhaps as high as 100 amperes. While the current requirements and number of turns in the coil make low frequency operation undesirable, the modulation of the plasma potential is reduced at these frequencies because the capacitive impedance is inversely proportional to the frequency. Thus, it may be possible to operate at low frequencies and high currents without a split Faraday shield, or alternatively, less effective shielding could be used.

As with the ion etcher of the first embodiment, a split Faraday shield is interposed between the induction coil and the plasma. While the split Faraday shield of the first embodiment may be used here as well, FIG. 10 shows an alternative configuration. Referring to FIG. 10, there is both an inner 63 and outer 64 split Faraday shield. When a split Faraday shield is used, there is some capacitive coupling between the induction coil and the split Faraday shield. Since there is some inductance along the current path from the induction coil to ground (through the split Faraday shield), some voltage may appear on the shield and modulate the plasma potential. In the first embodiment, for instance, 5 to 10 volts may appear on the split Faraday shield, leading to approximately a 1 volt modulation of the plasma potential. With the double split Faraday shield shown in FIG. 10, this modulation can be even further reduced. Five to ten volts may appear on the outer split Faraday shield 64 due to capacitive coupling with the induction Coil. There may also be some capacitive coupling between the inner 63 and outer 64 split Faraday shields, but since the inductance along this path is finite, only about 1 volt appears on the inner split Faraday shield 63. This leads to only about 0.1 volt modulation of the plasma potential.

Figure 11B:
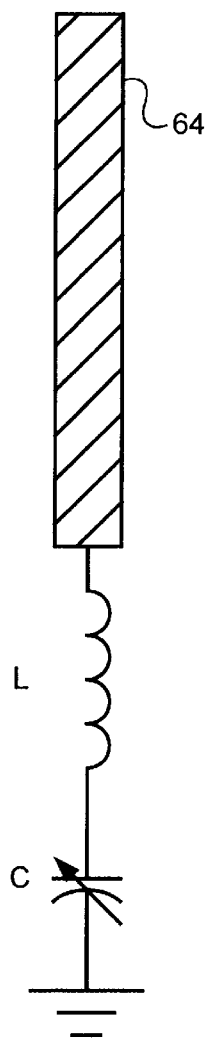
FIG. 11B is a circuit used to provide an impedance $Z_s$ in the reactor of the second embodiment.

To further reduce any capacitively coupled voltage on the split Faraday shields, the outer shield 64 may be connected to ground through an impedance $Z_s$ that is minimized for a given RF frequency. As shown in FIG. 11B, this impedance may be provided by a series LC circuit. Preferably the capacitor is adjustable, so the circuit may be tuned for the frequency of RF energy used. For RF energy at a frequency of 13.56 MHz and a power of between 500 and 1500 watts, an inductance L of ¼ microhenry, and a capacitance C of up to approximately 500 picofarads are preferred. As is known in the art, the capacitor may be adjusted so that the circuit has a resonance at the frequency of the RF power such that the impedance to ground is minimized. Inserting an adjustable impedance between the split Faraday shield and ground also provides an advantage in that a high impedance for a given frequency may be used at startup. This allows a high voltage to appear on the shield, which can be used initially to ignite the plasma. Then the impedance can be tuned to resonance to decrease the capacitive voltage for processing.

Gas is provided to the reactor from gas source 49. In the second embodiment, $O_2$ gas is provided at approximately 1–10 standard liters per minute, with 2 standard liters per minute being typical. It is believed, however, that flow rates from 100 standard cubic centimeters per minute up to 100 standard liters per minute may be effectively used in the second embodiment. The gas source 49 and an exhaust system 59 cooperate to maintain a flow from plasma to wafer and a pressure in the reactor chamber that promotes dissociation given the strength of the induction electric field. For oxygen gas based processes, pressures in the range of 1–5 torr are used, with 1.5 torr being preferred. However, pressures as low as 0.1 torr may be used even though ion density increases, because the split Faraday shield reduces ion bombardment. Further, as described below, filtering techniques may be used to remove residual charged particles.

In addition, other gases may be used to enhance stripping. In particular, as is known in the art, gases may be added to oxygen in small concentrations to attack specific chemical residues that may form on the resist. During etching, the resist may become very hard and dense. Ion implantation may occur and impurities such as boron or arsenic may become embedded in the resist. Etch processes may also produce a $SiO_2$ residue or implant aluminum contaminants in the resist. As is known in the art, these and other side effects from wafer processing can create a resist or film that is very resistent to reaction with oxygen atoms alone. Additives that make soluble or volatile compounds with a given chemical residue or contaminant may be added to enhance the removal of the resist. Any one of a variety of additives may be selected depending upon the composition of the resist and the etch process used. Common additives include Ar, He, $SF_6$, $Cl_2$, $CHF_3$, $C_2F_6$, CFC's, $N_2$, $N_2O$, $NH_3$, $H_2$, water vapor, or the like. For instance, after a polysilicon etch process, using a normal resist, $CF_4$ is preferably added to the $O_2$ gas in concentrations of 0.2% to 10% in order to enhance resist removal. Importantly, these additives may be used without substantial etching and wear of the reactor chamber, because, as described above, the split Faraday shield reduces the modulation of the plasma potential.

In the reactor according to the second embodiment, large volumes of gas are dissociated and uniformly diffused in the flowing stream across a wafer surface. The efficiency of conversion may be as high as 50% or more and a stripping rate exceeding 10 microns per minute may be achieved. A uniformity of a few percent may be achieved and the damage to the wafer is low. Damage to the wafer is measured by looking at the flatband voltage shift in the CV curve of the wafer after processing. Mobile sodium or other contaminants may be imbedded in the wafer and degrade the performance of insulating material like $SiO_2$. For the second embodiment, the mobile ion density deduced from the CV shift of a typical wafer is on the order of $10^{10}/cm^2$. Conventional reactors that use physical barriers to separate the plasma from the wafer typically have lower strip rates and worse uniformity, while reactors that do not separate the plasma may cause mobile ion concentrations as high as $10^{12}/cm^2$.

Figure 12:
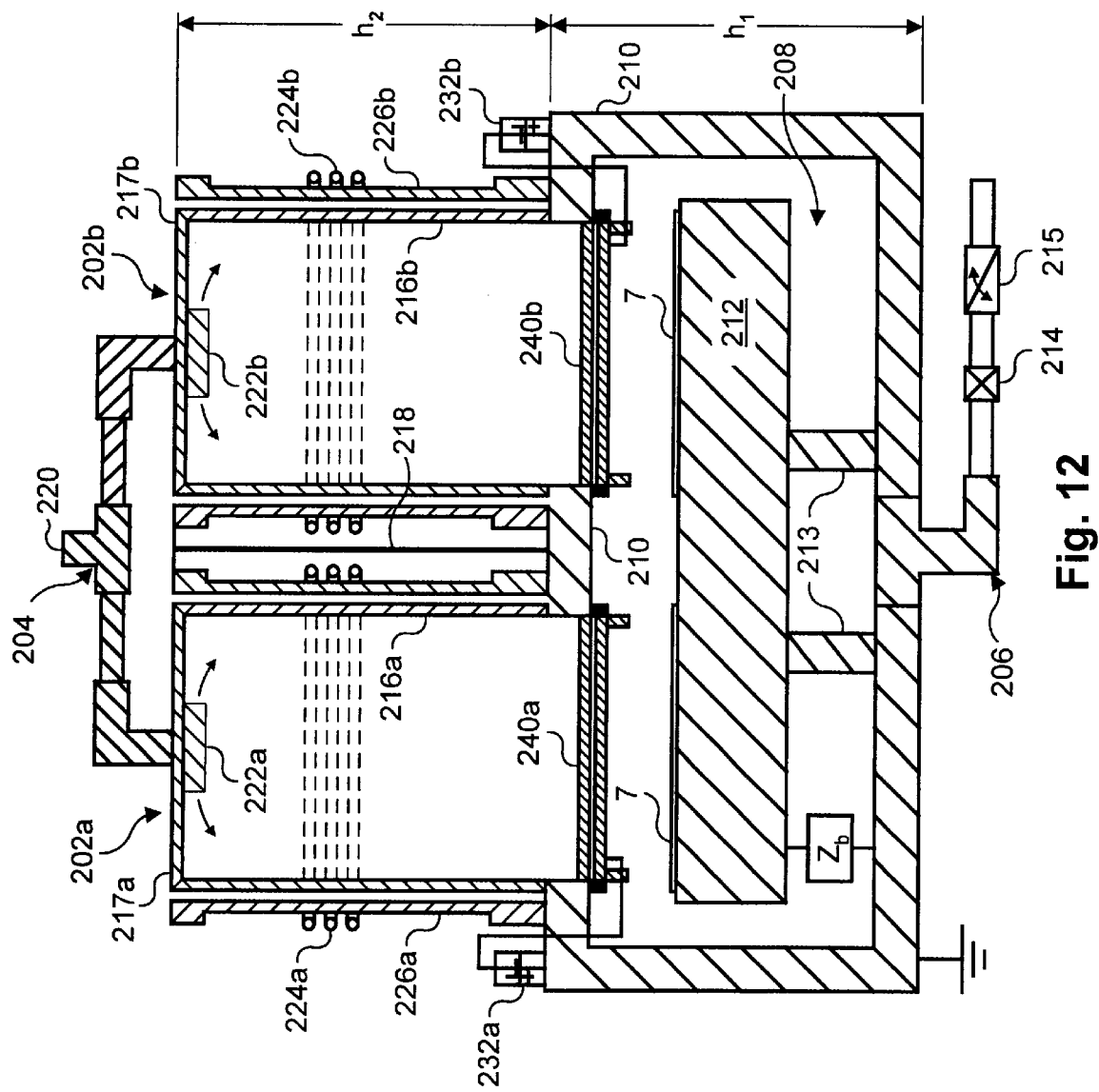
FIG. 12 is a side cross-sectional view of a dual plasma reactor system according to a third embodiment of the present invention.

FIG. 12 illustrates a third embodiment of the present invention which is presently preferred for removing residual resist and contaminants from semiconductor wafers and the like. FIG. 12 shows a side cross-sectional view of a dual reactor system according to the third embodiment. In the third embodiment, two cylindrical plasma generation chambers 202a and 202b are arranged side by side. Similar elements are used in conjunction with the two plasma generation chambers 202a and 202b. These similar elements are labeled with the same reference numeral for each chamber in FIG. 12, although suffixes "a" and "b" have been added to differentiate between elements for generation chamber 202a and 202b respectively. These elements may be referred to generally by their reference numeral without any appended suffix. While the two generation chambers use substantially duplicate elements and operate substantially independently, they share a gas supply system 204, an exhaust system 206 and a wafer processing chamber 208. The system of the third embodiment is configured for concurrent processing of two wafers which doubles throughput.

The reactor system of the third embodiment operates in a manner similar to that described for the second embodiment. However, a single split Faraday shield and a charged particle filter are used. The split Faraday shield is grounded and has widened slots that allow slight capacitive coupling of energy into the plasma from the induction coils. This helps ignite and sustain the plasma reaction, although it does introduce a slight modulation of the plasma potential. While there is a slight modulation of the plasma potential (on the order of 10 volts), the modulation is still greatly reduced by the split Faraday shield. This combination of a single split Faraday shield and a charged particle filter allows a sustained plasma reaction to be easily maintained, while actually reducing the charged particle exposure of the wafer. In addition, the charged particle filter blocks UV radiation produced in the plasma from reaching the wafer. This UV radiation might otherwise cause damage to an $SiO_2$ layer or $SiO_2/Si$ interface of a wafer. Finally, the design of the charged particle filter actually enhances the diffusion of neutral activated species and therefore does not degrade the uniformity of stripping as do some conventional barrier systems.

Figure 13:
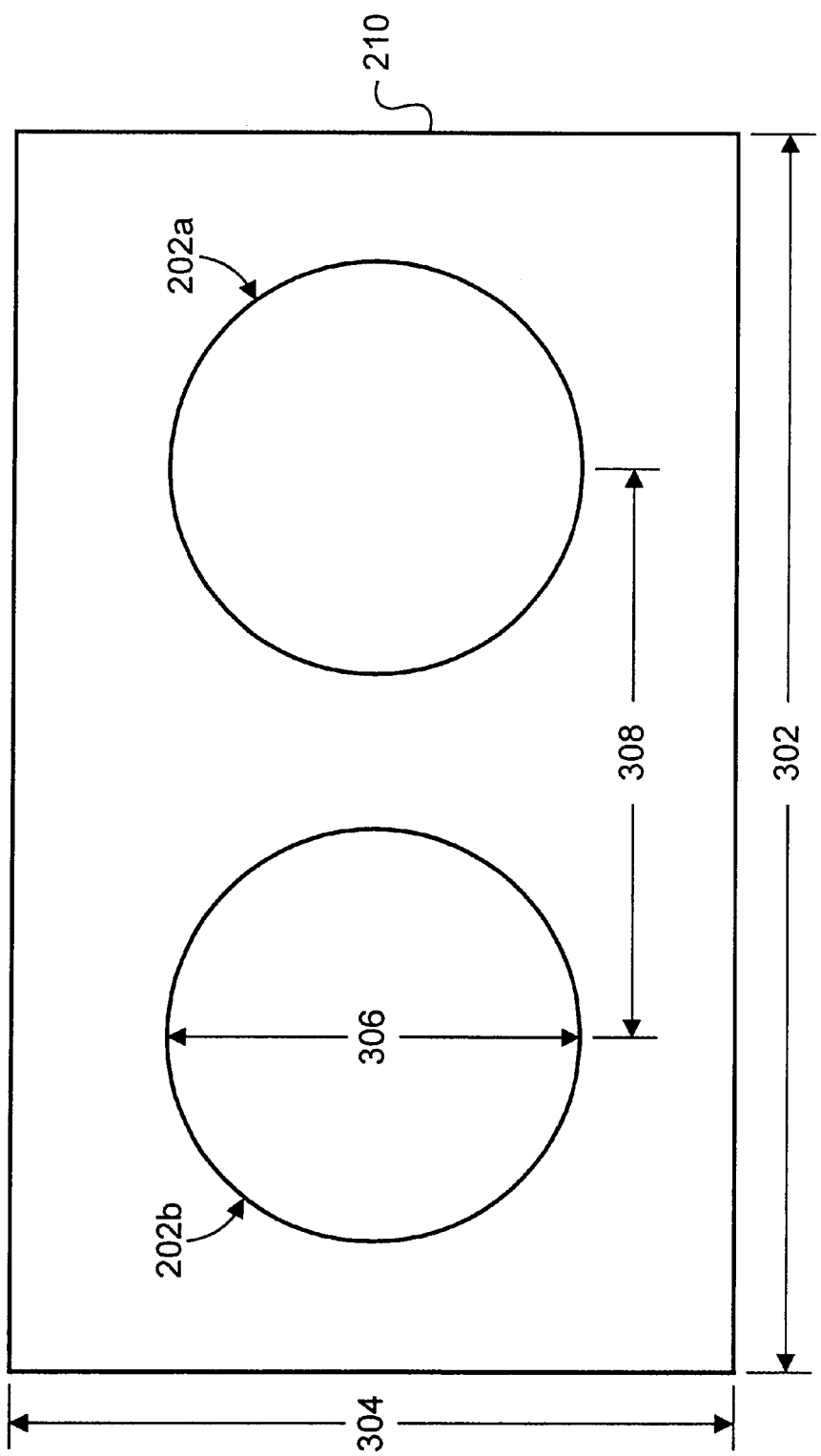
FIG. 13 is a simplified top plan view of a dual plasma reactor system according to the third embodiment.

The structure of the reactor system according to the third embodiment will now be described in detail. In the third embodiment, two wafers may be placed in a processing chamber 208 for resist stripping, residue or contaminant removal, descum or the like. The processing chamber 208 is rectangular, and has a height, h1, of approximately 25 cm. FIG. 13 shows a simplified top plan view of the reactor system according to the third embodiment. Referring to FIG. 13, the width 302 of the processing chamber is approximately 60 cm. The depth 304 of the processing chamber measured from the outside of processing chamber wall 210 is approximately 35 cm. The plasma generation chambers 202a and 202b are situated above the processing chamber and have an outer diameter 306 of approximately 20 cm as shown in FIG. 13. The plasma generation chambers are separated by a distance 308 of approximately 28 cm from center to center.

Referring to FIG. 12, the processing chamber wall 210 is approximately 2.5 cm thick and is grounded. The processing chamber wall 210 provides a common ground for the system, and comprises a conductive material such as aluminum or the like. Within the processing chamber is an aluminum block 212 that acts as a conductive heater and as a support for wafers 7. From center to center, two 20 cm wafers 7 may be placed approximately 28 cm apart on the aluminum block 212 for processing. Of course, the present invention may be readily adapted for use with wafers of other sizes as well. The aluminum block 212 is maintained at an elevated temperature that is favorable to the desired reactions at the wafer surface. Preferably the aluminum block 212 is maintained at about 250° C. for most resist stripping. Other temperatures may be desirable for certain processes. For instance, a temperature of between 150° C. and 180° C. may be used for implant resist removal, and a temperature of approximately 100° C. may be used for descum. A heating unit, as described and shown for the second embodiment may be used to heat the aluminum block, although the heating unit has not been shown in FIG. 12 for purposes of clarity. The aluminum block 212 is positioned on a cylindrical ceramic support 213 and is RF isolated. In particular, an element $Z_b$ may be placed between the aluminum block 212 and a ground potential as described for the second embodiment to produce a high impedance of the block to around at the frequency of excitation. The ground potential may be provided by the processing chamber wall 210. This RF isolation allows the potential of the aluminum block 212 to be maintained at or near the same potential as the volume of the processing chamber directly above the wafers 7. This helps reduce the charged particle current driven to the wafers 7.

Below the ceramic support 213 is a gas exhaust system 206. The gas exhaust system 206 may be driven by a conventional fan, pump or similar device. The ceramic support 213 is slotted to allow gases to reach the exhaust system from the perimeter of the aluminum block 212. This promotes a gas flow radially from the center of wafers 7 to the perimeter of the aluminum block. The gases then flow under the aluminum block through the slots in the ceramic support 213 and to the exhaust system 206. The exhaust system 206 has a shut off valve 214 that allows the exhaust system to be shut off. In addition, a throttle valve 215 is provided for regulating the flow of gases in the exhaust system 206.

The top of processing chamber 208 is approximately 5–6 cm above the surface of wafers 7. This provides a distance over which gases may diffuse and flow across the surface of the wafers. Above each wafer 7 is a plasma generation chamber 202a and 202b. The plasma generation chambers have a height, h2, of approximately 25 cm and as shown in FIG. 13 have an outer diameter 306 of approximately 20 cm. Referring to FIG. 12, the generation chamber walls 216 are made of a nonconductive material such as quartz or alumina and have a thickness of approximately 4 to 6 mm. The generation chamber walls 216 are fixed at their base to the processing chamber wall 210 at the top of the processing chamber 208. The top lid 217 of the generation chambers is aluminum or similar conductive material in the third embodiment. The two plasma generation chambers 202a and 202b are separated by a conductive partition 218 to prevent any electromagnetic interference between them. In the third embodiment, the partition 218 comprises a thin (approximately 1/16 inch thick) sheet of aluminum. The partition may be an integral part of a safety cage that encloses the generation chambers and the induction coils and prevents the radiation of electromagnetic interference into the surrounding environment. For purposes of clarity, the safety cage is not shown in FIG. 12.

A gas supply system 204 is provided above the plasma reactor chambers 202. In the center is an input pipe 220 that can be used to provide gases (such as oxygen) to the plasma reactor chambers. As described above, additives may also be introduced through input pipe 220 for residue removal after basic ashing with oxygen gas. Typically, oxygen gas will be used to ash to endpoint (which is determined by the absence of CO emission). Then oxygen gas is used to over ash for a period approximately equal to 100% of the period required to ash to endpoint. Then an additive, such as $CF_4$, is added to the oxygen in a concentration of about 0.2% to 10% and introduced to the generation chambers through input pipe 220 for about 15 seconds in order to remove residual contaminants. In the third embodiment, a shower head type nozzle 222 disperses the gas laterally into the generation chambers to enhance uniformity.

In the third embodiment, $O_2$ gas is provided at approximately between 1 and 20 standard liters per minute through input pipe 220, with 4 standard liters per minute being typical (2 standard liters per minute for each plasma generation chamber). It is believed, however, that flow rates from 200 standard cubic centimeters per minute up to 200 standard liters per minute may be effectively used in the third embodiment. The gas supply system 204 and the gas exhaust system 206 cooperate to maintain a flow from plasma to wafer and a pressure in the reactor chamber that promotes dissociation given the strength of the induction electric field. For oxygen gas based processes, pressures in the range of 1–5 torr are used, with 1.5 torr being preferred. However, pressures as low as 0.1 torr may be used even though ion density increases, because the split Faraday shield and a charged particle filter (described further below) reduce ion bombardment.

Encircling the generation chamber walls 216 are induction coils 224. The induction coils are connected to an RF source (not shown) through a conventional impedance match network (not shown), as described previously. In the third embodiment, the induction coils 224a and 224b each have three turns. The induction coils 224a and 224b preferably have a conductor diameter of approximately ¼ inch, and are turn-to-turn separated by approximately ⅝ of an inch from center to center. The diameter from the center of the coil on one side of a plasma generation chamber to the center of the coil on the other side of the plasma Generation chamber is approximately 9 inches. The center of the middle turn of the induction coil is almost half way down the plasma generation chamber, approximately 11 cm from the top of the plasma reactor chamber and approximately 14 cm from the top of the processing chamber 208. This allows a plasma to be generated and substantially confined to the middle region of the plasma processing reactor.

In the third embodiment, RF energy is preferably applied to the induction coil at a frequency of 13.56 MHz and at a power of between 500 and 1500 watts. The induction coil produces within the middle portion of the plasma generation chambers 202 an axially symmetric RF magnetic field whose axis is substantially vertical and an induction electric field that is substantially circumferential. Both of these fields exhibit a rotational symmetry about a central axis. In this configuration, the plasma is concentrated in the shape of what approximates an annular toroid in the middle of the plasma reactor chambers. It will be understood, however, that the electric fields are not completely symmetrical and in fact are stronger near the generation chamber wall 216 than in the center of the plasma generation chambers. The electric field and density of the plasma reach a peak in the center of the annular toroid. In the third embodiment, a typical value for the peak electric field, E, is approximately 40 V/cm at the highest point in the reactor chamber and a typical value for the density of the gas, $N_g$ is approximately $10^{16}/cm^3$ to $10^{17}/cm^3$. $E/N_g$ is preferably no greater than approximately $10^{-15}$ $Vcm^2$ and the peak ion density at the center of the plasma is preferably less than about $10^9/cm^3$.

Figure 14:
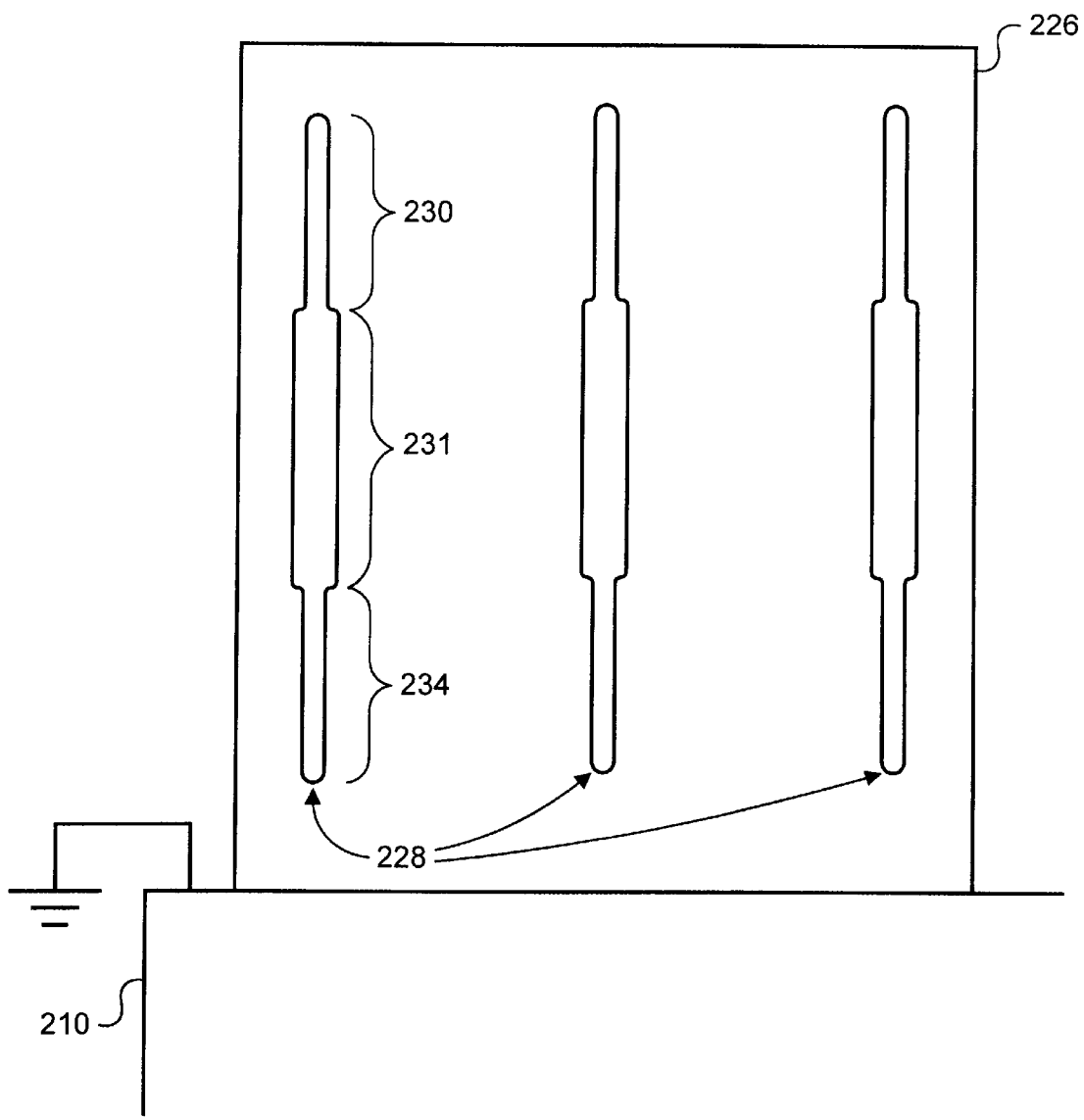
FIG. 14 is a simplified side view of a plasma reactor system illustrating the structure of a split Faraday shield according to the third embodiment.

As with the first and second embodiments, a split Faraday shield is interposed between the induction coil and the plasma. In the third embodiment, a single split Faraday shield with widened slots is used. FIG. 14 illustrates the structure of a split Faraday shield 226 according to the third embodiment. The split Faraday shield has vertical slots that start approximately ¾ inch from the top of the plasma generation chambers 202 and end approximately 1¼ inches above the top of the processing chamber 208. This allows the split Faraday shield to be an integral part which simply fits over the plasma reactor chamber. The bottom of the split Faraday shield is connected to the top of the processing chamber which provides a common ground for all of the sections of the split Faraday shield.

In the third embodiment, the split Faraday shield is designed to allow some modulation of the plasma potential. This makes it easier to ignite and maintain a plasma reaction in the plasma generation chambers. Nevertheless, the split Faraday shield blocks substantial capacitive coupling and limits the modulation to a desired amount (order of magnitude 10 volts in the third embodiment). The number and width of slots in the split Faraday shield may be selected to control the level of capacitance coupling and modulation. The slots 228 in the split Faraday shield 226 of the third embodiment start out with a slot width of approximately 3/16 inch in top portion 230 and widen to approximately ⅜ inch in the middle portion 231. The induction coil 224 surrounds the split Faraday shield around this widened middle portion 231 of the slots. The slots then narrow again to 3/16 inch in a bottom portion 234. The top and bottom narrow portions 230 and 234 of the slots are approximately 2½ inches long and the widened middle portion 234 is approximately 3 inches long. For the split Faraday shield of the third embodiment, there are 8 slots with adjacent slots being separated by a distance of approximately 8.35 cm apart from center to center. This is in contrast to a split Faraday shield designed to maximally block capacitive coupling of the induction coil to the plasma. To more completely block capacitive coupling a large number of narrow slits (on the order of 30 or more) might be used, and a double split Faraday shield as described for the second embodiment might be used. While the split Faraday shield of the third embodiment may allow more modulation and produce more charged particles, the plasma reaction is easier to ignite and sustain and the structure of the split Faraday shield is less complex.

Referring to FIG. 12, the split Faraday shield 226 is interposed between the induction coils 224 and the generation chamber walls 216. Preferably, the split Faraday shield is approximately 5/16 inch from the induction coil 224. The split Faraday shield 226 has a width of approximately 115 thousandth of an inch in the section containing the slots 228. The top and bottom portions of the split Faraday shield 226 that do not contain the slots may be even thicker (approximately ½ inch thick) to provide a more rigid structure for the split Faraday shield.

To reduce the charged particle current reaching the wafers 7 and to block UV radiation that may be generated in the plasma from reaching the wafers 7, a charged particle filter 240 is provided between the plasma reactor chambers 202 and the processing chamber 208. The charged particle filter 240 is particularly desirable in the third embodiment, since the split Faraday shield allows some modulation of the plasma potential. However, the charged particle filter may also be advantageously used in the second embodiment as well as in other types of reactors and stripping systems. Such a charged particle filter may be applied in any number of situations where it is desirable to filter charged particles from a gas flow.

Figure 15A:
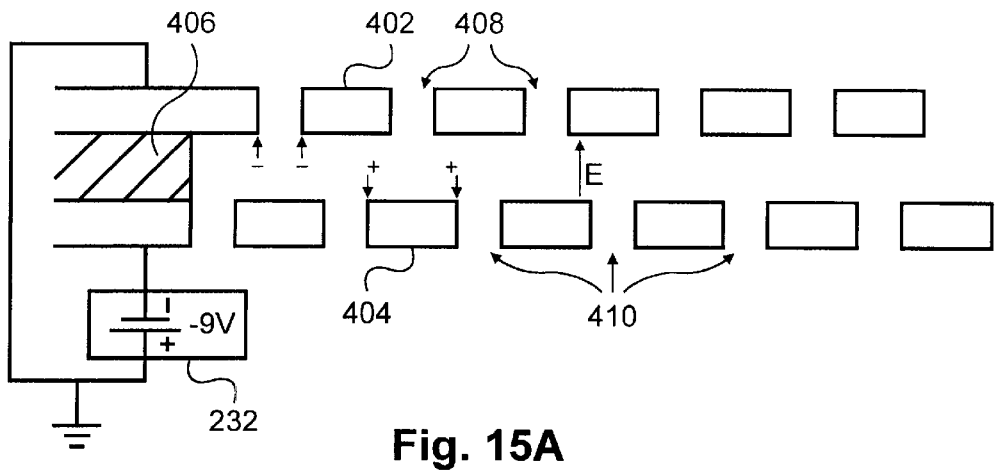
FIG. 15A is a simplified side cross-sectional view of a charged particle filter according to the third embodiment.
Figure 15B:
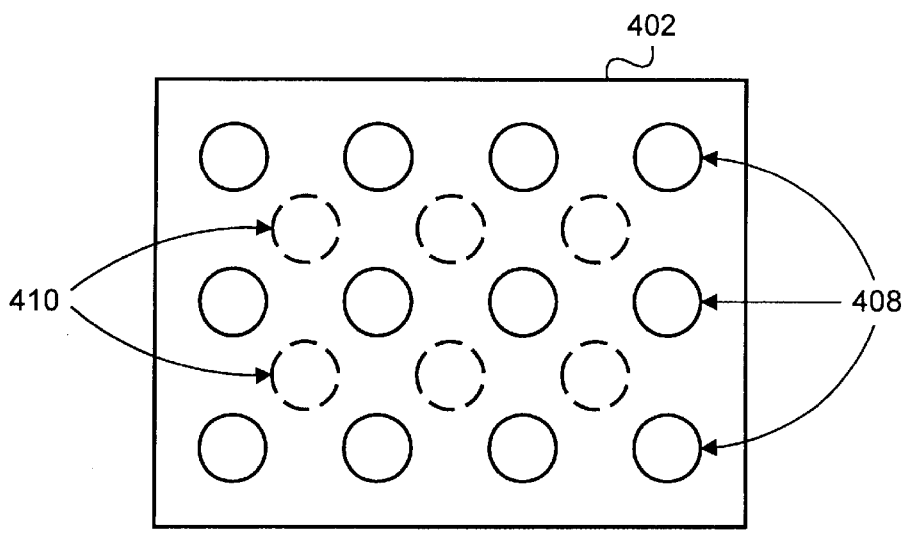
FIG. 15B is a top plan view of a grid used in a charged particle filter according to the third embodiment.

The charged particle filter 240 of the third embodiment is shown in additional detail in FIG. 15A. The charged particle filter includes an upper grid 402 and a lower grid 404 made out of a conductive material such as aluminum. This is because the oxide that forms on their surface is both resistant to attack by fluorine atoms and does not catalyze recombination of oxygen atoms into molecules as other metals such as copper would. The grids are preferably separated by approximately 40–50 thousandths of an inch, and are approximately 0.16 inches thick. The grids are held apart by a block of insulating material 406 such as quartz, alumina or mica. Each grid has an array of holes. The holes are approximately 0.156 inches in diameter and are separated by a distance of approximately 0.28 inches from center to center. The array of holes 410 in the lower grid 404 are offset from the array of holes 408 in the upper grid 402. FIG. 15B is a top plan view of upper grid 402 showing the arrangement of the array of holes 408. In addition, the arrangement of the array of holes 410 relative to the array of holes 408 is indicated with dashed lines in FIG. 15B. Preferably, there is no line of sight all the way through the upper and lower grids 402 and 404. This prevents potentially damaging UV radiation in the plasma generation chambers from reaching the wafers 7. In addition, it forces charged particles and dissociated atoms to follow a non-linear path through the filter. This provides additional time for the neutral activated species to diffuse uniformly, and provides time for charged particles to be filtered from the gas flow.

Charged particles are filtered from the gas flow through collisions with the grids 402 and 404. This process is enhanced by inducing an electric field between the upper and lower grids 402 and 404. In the third embodiment, the upper grid 402 is electrically connected to the wall of the processing chamber 210 and thereby grounded. The lower grid 404 is connected to a direct current power source 232 (such as a battery or the like) which places a potential on the lower grid relative to ground. Although two power sources 232a and 232b are shown in FIG. 12, it will be readily understood that a single power source may be used for both charged particle filters 240a and 240b. In the third embodiment, the potential is approximately −9 volts, although it will be readily understood by those of ordinary skill in the art that other potentials may be used. Alternatively, for instance, a positive potential could be used. The purpose of applying different potentials to the upper and lower grids is to induce an electric field in the cavity between the two grids. However, it will be understood that the potential difference between grids should be limited so as not to induce ionization between the grids. It will be appreciated that the scope of the present invention is broad enough to encompass other methods of inducing charged particle collection (such as by using a magnetic field to direct drifting charged particles in the flowing gas toward conducting vanes or plates where they are collected).

The electric field between the grids attracts charged particles toward one of the grids while allowing a neutral activated species (such as dissociated atoms) to pass through substantially unimpeded. When a negative potential relative to the upper grid is applied to the lower grid, an electric field, E, is induced in the direction of the upper grid as shown in FIG. 15A. Thus, negative charged particles entering the filter 240 (e.g. electrons) are attracted to the upper grid 402, while positive charged particles (e.g. ions) are attracted to the lower grid 404. This electric field greatly enhances removal of charged particles from the gas flow by attracting the charged particles to the grids where they collide and are extracted from the gas flow.

Figure 15C:
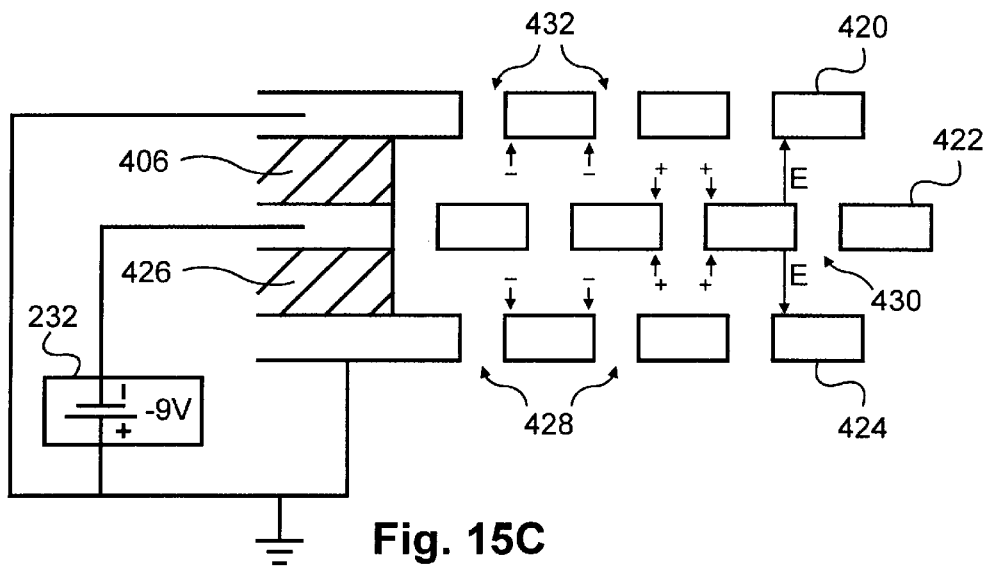
FIG. 15C is a simplified side cross-sectional view of a three grid charged particle filter according to the present invention.

FIG. 15C illustrates an alternative charged particle filter according to the present invention that uses three grids. In the alternative embodiment of FIG. 15C, three grids are used, an upper grid 420, a middle grid 422, and a lower grid 424. The configuration and relation between the upper and middle grids is the same as that described above with reference to FIG. 15A. A third lower grid 424 is added below the middle grid 422. The lower grid 424 is separated from the middle grid 422 by approximately 40–50 thousandths of an inch. The lower and middle grids 424, 422 are held apart by a second block of insulating material 426 such as quartz, alumina or mica. An array of holes 428 in the lower grid 424 is offset from an array of holes 430 in the middle grid 422 in the same manner as described previously with reference to FIGS. 15A and 15B. The array of holes 428 may have the same arrangement as an array of holes 432 in the upper grid 420 which is also offset from the array of holes 430 in the middle grid 422. Preferably, there is no line of sight directly through the middle and lower grids 422 and 424. As with the upper and middle grids 420 and 422, the middle and lower grids 422 and 424 block UV radiation and force charged particles and dissociated atoms to travel through a non-linear path. An electric field is induced between the middle and lower grids 422 and 424. This may be accomplished by applying a potential to the lower grid 424 different than that applied to the middle grid 422 to induce an electric field. For the embodiment shown in FIG. 15B, a −9 volt potential relative to ground is applied to the middle grid 422 and a ground potential is applied to the lower grid 424. Of course, it will be readily understood that other potentials and other methods could be used to induce an electric field between the middle and lower grids 422 and 424. However, the electric field should be limited so as not to induce ionization between the grids. As described above with reference to FIG. 15A, the induced electric field attracts charged particles to the grids which enhances filtering. For the alternative embodiment shown in FIG. 15C, positive charged particles (e.g. ions) are attracted to the middle grid 422, while negative charged particles (e.g. electrons) are attracted to the lower grid.

The charged particle filters described with reference to FIGS. 15A, 15B, and 15C greatly reduce the concentration of charged particles that reach wafers 7. With no filter, it is estimated that approximately 0.1 uA/cm$^2$ of charged particle current reaches the wafers 7. With a single grid at ground potential, approximately 10 nA/cm$^2$ of charged particle current reaches the wafers 7. With two grids having a 9 volt potential difference, less than 0.1 nA/cm$^2$ (potentially as little as 1 pA/cm$^2$) of charged particle current reaches the wafers 7. Adding a third grid having a 9 volt potential difference relative to the second grid, could reduce charged particle current that reaches the wafers 7 to less than 1 pA/cm$^2$.

In a similar manner to that described above, additional grids may be added, although each additional grid slightly reduces the rate of ashing. However, the inductively coupled plasma of the third embodiment provides an abundant amount of dissociated oxygen with reduced modulation of tne plasma potential. This allows several grids to be used while still allowing high strip rates of up to approximately 6 microns per minute to be achieved. It will also be noted that by using a plurality of equidistant holes in the filter system of the third embodiment, processing uniformity is maintained in contrast to some conventional barrier or nozzle methods for separating a plasma from a wafer. In addition, the split Faraday shield allows a grid with closely spaced holes with small diameters to be used near the plasma without causing hollow cathode discharge in the holes. Without using the split Faraday shield to reduce the modulation of the plasma potential, it may be difficult to produce a plasma with enough energy to dissociate abundant oxygen atoms without pushing the plasma down to the grid and thereby also inducing hollow cathode discharges in the holes of the grids. Hollow cathode discharges in the filter could cause a dense plasma (with significant charged particles) to form in the filter. This would impair the filter's ability to extract charged particles from the gas flow.

Figure 16:
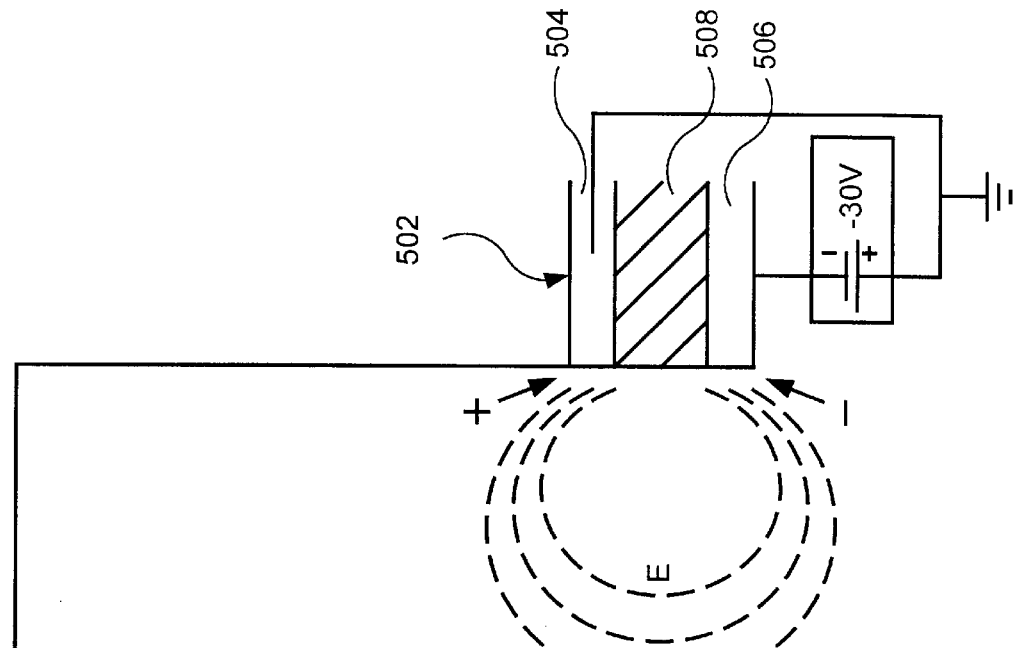
FIG. 16 is a simplified side cross-sectional view of an alternative embodiment of a charged particle filter according to the present invention.
Figure 16:
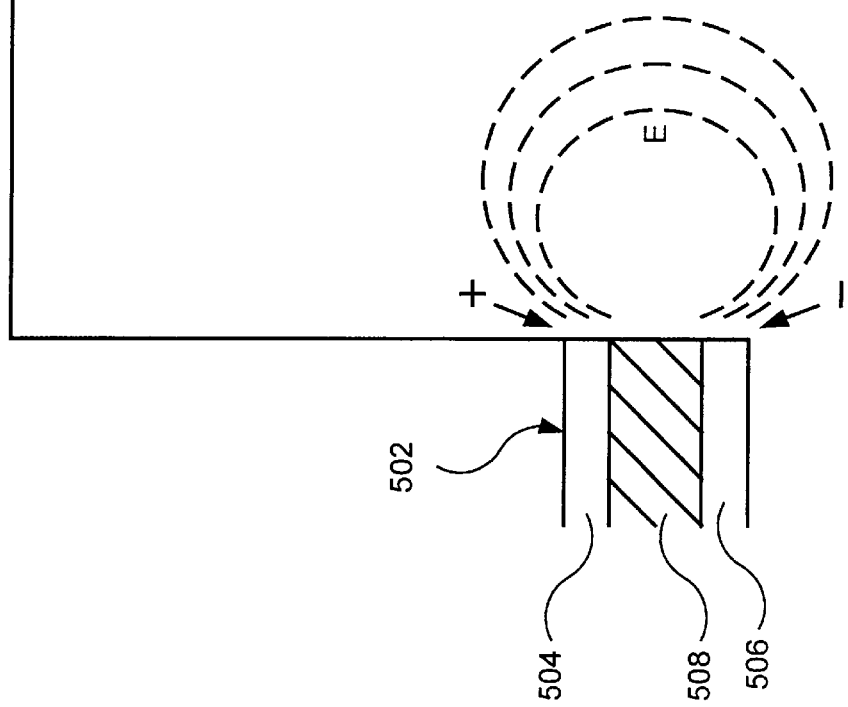

An alternative charged particle filter system 502 is shown in FIG. 16. In the filter system 502, two conductive rings 504 and 506 are separated by a block of insulating material 508 such as quartz or alumina. The upper ring 504 is grounded while a potential is applied to the lower ring 506. For the embodiment shown in FIG. 16, a potential of −30 volts relative to ground is applied to the lower ring 506. This induces an electric field, $E_f$, in the plasma reactor chamber and attracts charged particles to the conductive rings 504 and 506. Of course, other methods for producing an electric field to extract charged particles may be used as well as magnetic filters which sweep the charged particles into conducting metal plates as the flowing gas carries them down from the plasma toward the wafer. It will be noted, however, that the embodiment illustrated in FIG. 16 does not block UV radiation that may be produced in the plasma and that may damage an $SiO_2$ layer or an $SiO_2/Si$ interface on a wafer. In addition, the filter system of FIG. 16 is not as effective as the filter systems described with reference to FIGS. 15A, 15B, and 15C.

The foregoing description is presented to enable any person skilled in the art to make and use the invention. Descriptions of specific designs and dimensions are provided only as examples. Various modifications to the preferred embodiment will be readily apparent to those skilled in the art, and the generic principles defined herein may be applied to other embodiments and applications without departing from the spirit and scope of the invention. For instance, the gases used and the composition of the plasma can be altered to suit a variety of processes. In particular, the strength of the induction electric field and the pressure of the plasma can be altered to adjust the relative concentrations of dissociated atoms and ions. In this way, a reactor according to the present invention can be adapted for a wide variety of processes. For instance, an argon/oxygen combination at approximately 1 torr could be used for isotropic descum after photolithography. An anisotropic descum could be performed by lowering the pressure below about 0.1 torr in order to increase the ion density and by putting an RF bias on the block. Selective etch of $Si_3N_4$, which may be useful for a pad etch, can be accomplished by using a combination of argon or helium with $SF_6$ at a pressure from approximately 0.1 torr to 3 torr. Isotropic silicon etch, which may be useful for contact clean, may be accomplished using argon or helium with $H_2$ and/or $SF_6$ or $NF_3$ at a pressure from approximately 0.1 torr to 3 torr. Thus, the present invention is not intended to be limited to the embodiments shown, but is to be accorded the widest scope consistent with the principles and features disclosed herein.

While the most practical and preferred embodiments of the invention have been disclosed, it will be readily apparent to those skilled in the art that the invention is not limited to the disclosed embodiments but, on the contrary, is intended to cover numerous other modifications and equivalent arrangements which are included within the spirit and scope of the following claims.

| Reference Numerals | |
|---|---|
| 1 | reactor wall |
| 2 | plasma reactor chamber |
| 3 | gas source |
| 4 | exhaust system |
| 5 | RF power supply |
| 6 | powered electrode |
| 7 | wafer |
| 8 | slit valve |
| 9 | plasma body |
| 10 | plasma sheath |
| 11 | outer tube |
| 12 | inner tube |
| 13 | holes |
| 14 | gas pipe |
| 15–16 | electrodes |
| 17 | wafers |
| 21–24 | elements modeling sheath impedance |
| 25 | low impedance resistance |
| 26–28 | elements modeling sheath impedance |
| 31 | RF signal |
| 32 | plasma voltage |
| 33 | peak of signal 32 |
| 34 | peak of signal 31 |
| 35 | ground |
| 36 | sheath voltage of the powered electrode |
| 40 | base |
| 41 | chamber wall |
| 42 | induction coil |
| 43 | first RF source |
| 44 | match network |
| 45 | Faraday shield |
| 46 | conductive plates of Faraday shield |
| 47 | high voltage end of coil 42 |
| 48 | gaps between Faraday shield plates |
| 49 | gas source |
| 50 | plasma reactor chamber |
| 51 | second RF source |
| 52 | powered electrode |
| 53 | grounded conductive plate |
| 54 | magnets |
| 55 | ferromagnetic return plate |
| 56 | conductive coil |
| 57 | DC current source |
| 58 | exhaust port |
| 59 | exhaust system |
| 60 | aluminum block |
| 61 | heating unit |
| 62 | plasma |
| 63 | inner split Faraday shield |
| 64 | outer split Faraday shield |
| 71 | RF voltage signal |
| 72 | plasma voltage signal |
| 73 | peak of plasma voltage signal |
| 74 | peak of RF voltage signal |
| 76 | DC component of plasma voltage signal |
| 92 | electron energy distribution curve for $E/N_g \sim 2.2 \times 10^{-16}$ $Vcm^2$ |

-continued

Reference Numerals

| | |
|---|---|
| 94 | electron energy distribution curve for $E/N_g \sim 4.4 \times 10^{-16}$ Vcm$^2$ |
| 96 | electron energy distribution curve for $E/N_g \sim 8.8 \times 10^{-16}$ Vcm$^2$ |
| 98 | electron energy distribution curve for $E/N_g \sim 10.9 \times 10^{-16}$ Vcm$^2$ |
| 202 | plasma generation chambers |
| 204 | gas supply system |
| 206 | gas exhaust system |
| 208 | wafer processing chamber |
| 210 | processing chamber wall |
| 212 | aluminum block |
| 213 | ceramic support |
| 214 | shut off valve |
| 215 | throttle valve |
| 216 | generation chamber wall |
| 217 | top lid of generation chambers |
| 218 | partition |
| 220 | input pipe |
| 222 | nozzle |
| 224 | induction coils |
| 226 | split Faraday shield |
| 228 | slots in split Faraday shield |
| 230 | top portion of slots |
| 231 | middle portion of slots |
| 232 | DC power source |
| 234 | bottom portion of slots |
| 240 | charged particle filter |
| 302 | width of processing chamber |
| 304 | depth of processing chamber |
| 306 | outer diameter |
| 308 | distance |
| 402 | upper grid |
| 404 | lower grid |
| 406 | ring or layer of insulating material |
| 408 | array of holes in grid 402 |
| 410 | array of holes in grid 404 |
| 420 | upper grid |
| 422 | middle grid |
| 424 | lower grid |
| 426 | ring or layer of insulating material |
| 428 | array of holes in grid 424 |
| 430 | array of holes in grid 422 |
| 432 | array of holes in grid 420 |
| 502 | filter system |
| 504 | upper conductive ring |
| 506 | lower conductive ring |
| 508 | ring of insulating material |

What is claimed is:

1. A plasma reactor for processing a substrate comprising:
    a plasma chamber for producing a plasma;
    a source of radio frequency power;
    an induction coil adjacent to the plasma and coupled to the source of radio frequency power to inductively couple power into the plasma;
    a shield between the induction coil and the plasma, the shield having at least thirty substantially nonconductive gaps formed therein such that the induction coil inductively couples power to the plasma from the radio frequency source, the substantially nonconductive gaps each having a gap width less than a minimum spacing between the nonconductive gaps; and
    a support for the substrate positioned such that the substrate is exposed to products of the plasma for processing.

2. The plasma reactor of claim 1, wherein the gap width is less than about ⅜ inches.

3. The plasma reactor of claim 1, wherein the shield is configured to be substantially coupled to ground for at least a portion of the time that power is provided to the plasma.

4. The plasma reactor of claim 3, wherein the shield is substantially coupled to ground through an impedance that is minimized for a given RF frequency.

5. The plasma reactor of claim 1, wherein the shield is configured to be substantially ungrounded during ignition of the plasma.

6. The plasma reactor of claim 1, wherein the shield is configured to be substantially ungrounded relative to the induction coil for at least a portion of the time that power is provided to the plasma.

7. The plasma reactor of claim 1, further comprising a charged particle filter disposed between the plasma and the substrate.

8. The plasma reactor of claim 7, wherein the charged particle filter comprises a first grid forming an array of closely spaced openings.

9. The plasma reactor of claim 8, wherein the charged particle filter further comprises a second grid forming an array of closely spaced openings offset from the array of closely spaced openings of the first grid.

10. The plasma reactor of claim 9, further comprising a power source coupled to the charged particle filter such that an electric field is induced between the first and the second grids to enhance filtration of charged particles.

11. A method of processing a substrate in a plasma reactor, the method comprising the steps of:
    supplying a gas to a reaction chamber;
    providing a shield adjacent to the reaction chamber, the shield having at least thirty substantially nonconductive gaps formed therein to allow passage of inductively coupled power to the gas in the reaction chamber, the substantially nonconductive gaps each having a gap width less than about ⅜ inches;
    inductively coupling power through the shield to the gas to produce a plasma; and
    exposing the substrate to products of the plasma for processing.

12. The method of claim 11, wherein the substantially nonconductive gaps each have a gap width less than a minimum spacing between the nonconductive gaps.

13. The method of claim 11, further comprising substantially coupling the shield to ground during at least a portion of the time that power is provided to the plasma.

14. The method of claim 13, further comprising substantially ungrounding the shield to ignite the plasma.

15. The method of claim 11, further comprising substantially ungrounding the shield relative to the induction coil during at least a portion of the time that power is provided to the plasma.

16. A plasma reactor for processing a substrate comprising:
    a plasma chamber for producing a plasma;
    a source of radio frequency power;
    an induction coil adjacent to the plasma and coupled to the source of radio frequency power to couple power into the plasma;

a shield between the induction coil and the plasma, the shield having at least one substantially non-conductive gap configured to allow power to be inductively coupled by the induction coil through the shield;

the shield configured to be substantially ungrounded during at least a portion of the time that power is coupled from the induction coil into the plasma; and a support for the substrate positioned such that the substrate is exposed to products of the plasma for processing.

17. The plasma reactor of claim 16, wherein the shield includes at least thirty substantially nonconductive gaps.

18. The plasma reactor of claim 16, wherein the shield is configured to be ungrounded during ignition of the plasma.

19. The plasma reactor of claim 16, wherein the shield is configured to be grounded during at least a portion of the time that power is coupled from the induction coil into the plasma.

20. The plasma reactor of claim 16, further comprising a switch configured to switch the shield between the substantially ungrounded state and a substantially grounded state.

21. The plasma reactor of claim 20, wherein the switch comprises a tunable LC circuit.

22. A system for processing a plurality of substrates comprising:

a plurality of adjacent processing regions, each of the plurality of processing regions for processing a respective substrate;

a plurality of plasma chambers for producing a plasma, each of the plurality of plasma chambers associated with a respective one of the plurality of processing regions, wherein each of the plasma chambers is separated from the other plasma chambers by at least one wall;

a separate induction coil adjacent to each of the plurality of plasma chambers to inductively couple power into each plasma;

a shared gas supply system providing gas to each of the plasma chambers;

a shared gas exhaust system for exhausting gas from each of the processing regions;

at least one support for positioning the respective substrate in the processing region such that the substrate is exposed to products from the plasma of the associated plasma chamber for processing.

23. The system of claim 22, further comprising a separate capacitive shield between each induction coil and each plasma, each capacitive shield having at least one substantially non-conductive gap formed therein such that each induction coil inductively couples power to a respective plasma.

24. The system of claim 23, wherein each capacitive shield includes at least thirty substantially nonconductive gaps formed therein.

25. The system of claim 24, wherein the substantially nonconductive gaps each have a gap width less than a minimum spacing between the nonconductive gaps.

26. The system of claim 25, wherein the gap width is less than about 3/8 inches.

27. The system of claim 23, wherein each capacitive shield is substantially coupled to ground during at least a portion of the time that power is coupled from the inductive coil into the plasma.

28. The system of claim 27, wherein each capacitive shield is substantially coupled to ground through an impedance that is minimized for a given RF frequency.

29. The system of claim 28, wherein the impedance is provided by a series LC circuit.

30. The system of claim 23, wherein each capacitive shield is substantially ungrounded relative to each induction coil during at least a portion of the time that power is coupled from the induction coil into the plasma.

31. The system of claim 30, wherein the capacitive shield is maintained at a high impedance with respect to ground.

* * * * *